United States Patent
Vinciarelli

(10) Patent No.: US 9,508,485 B1
(45) Date of Patent: Nov. 29, 2016

(54) ISOLATOR WITH INTEGRAL TRANSFORMER

(71) Applicant: VLT, Inc., Sunnyvale, CA (US)

(72) Inventor: Patrizio Vinciarelli, Boston, MA (US)

(73) Assignee: VLT, Inc., Sunnyvale, CA (US)

(*) Notice: Subject to any disclaimer, the term of this patent is extended or adjusted under 35 U.S.C. 154(b) by 156 days.

(21) Appl. No.: 14/596,836

(22) Filed: Jan. 14, 2015

Related U.S. Application Data

(63) Continuation-in-part of application No. 14/289,598, filed on May 28, 2014, now abandoned, which is a continuation of application No. 13/645,133, filed on Oct. 4, 2012, now Pat. No. 8,772,909.

(51) Int. Cl.
| | |
|---|---|
| *H04L 25/02* | (2006.01) |
| *H05K 1/14* | (2006.01) |
| *H01F 27/28* | (2006.01) |
| *H01F 27/36* | (2006.01) |

(Continued)

(52) U.S. Cl.
CPC ............ *H01F 27/2804* (2013.01); *H01F 7/20* (2013.01); *H01F 27/36* (2013.01); *H02J 5/005* (2013.01); *H04L 25/0266* (2013.01); *H05K 1/028* (2013.01); *H05K 1/0298* (2013.01); *H05K 1/11* (2013.01); *H05K 1/145* (2013.01); *H01F 2007/068* (2013.01); *H01F 2027/2809* (2013.01); *H05K 1/165* (2013.01)

(58) Field of Classification Search
CPC H04L 25/0266; H05K 1/0298; H05K 1/145; H05K 1/165
See application file for complete search history.

(56) References Cited

U.S. PATENT DOCUMENTS

| | | | | |
|---|---|---|---|---|
| 3,409,805 | A | * 11/1968 | Whipple | H05K 1/144 |
| | | | | 336/200 |
| 5,754,088 | A | * 5/1998 | Fletcher | H01F 27/2804 |
| | | | | 336/200 |

(Continued)

FOREIGN PATENT DOCUMENTS

EP          0715322          4/1998

OTHER PUBLICATIONS

Analog Devices, "High Speed, ESD-Protected, Full-Duplex, iCoupler Isolated RS-485 Transceiver", 16 pages, 2006-2008.

(Continued)

*Primary Examiner* — Evan Pert
(74) *Attorney, Agent, or Firm* — Fish & Richardson P.C.

(57) ABSTRACT

A signal isolator apparatus includes a first substrate for supporting input circuitry including a high frequency oscillator circuit for receiving an input signal, a second substrate for supporting output circuitry including a detector circuit for providing an output signal; and a third substrate having parallel conductive layers separated by insulation. The third substrate has an upper conductive shield formed in a second conductive layer and a lower conductive shield formed in a fifth conductive layer. A transformer is formed between the upper and lower conductive shields and includes a primary winding formed in a third conductive layer and a secondary winding formed in a fourth conductive layer. The oscillator circuit is connected to the primary winding and adapted to excite the primary winding at a first frequency in response to the input signal, and the detector circuit is connected to the secondary winding and adapted to selectively sense the first frequency and provide the output signal. The third substrate is arranged to form a bridge connection between the first and second substrates.

75 Claims, 30 Drawing Sheets

(51) Int. Cl.
*H01F 7/20* (2006.01)
*H05K 1/11* (2006.01)
*H05K 1/02* (2006.01)
*H02J 5/00* (2016.01)
*H01F 7/06* (2006.01)
*H05K 1/16* (2006.01)

(56) References Cited

U.S. PATENT DOCUMENTS

| | | | | |
|---|---|---|---|---|
| 5,801,602 A * | 9/1998 | Fawal | ............... | H01F 17/0006 333/177 |
| 5,952,909 A | 9/1999 | Umeno et al. | | |
| 6,049,258 A * | 4/2000 | Fawal | ............... | H01F 17/0006 333/177 |
| 6,073,339 A | 6/2000 | Levin | | |
| 6,262,600 B1 | 7/2001 | Haigh et al. | | |
| 6,353,379 B1 * | 3/2002 | Busletta | ............ | H01F 27/2804 29/602.1 |
| 6,501,364 B1 * | 12/2002 | Hui | ...................... | H01F 27/365 336/200 |
| 6,765,469 B2 | 7/2004 | Sortor | | |
| 6,828,894 B1 * | 12/2004 | Sorger | ............. | H01F 27/2804 336/192 |
| 6,888,438 B2 * | 5/2005 | Hui | ...................... | H01F 27/365 336/200 |
| 6,914,508 B2 * | 7/2005 | Ferencz | ............. | H01F 27/266 29/602.1 |
| 7,042,325 B2 * | 5/2006 | Giandalia | ......... | H01F 17/0013 336/200 |
| 7,283,345 B2 * | 10/2007 | Liu | .................... | H03K 17/6877 361/118 |
| 7,332,993 B1 * | 2/2008 | Nussbaum | ......... | H01F 27/2804 336/200 |
| 7,414,507 B2 * | 8/2008 | Giandalia | ......... | H01F 17/0013 336/200 |
| 7,421,028 B2 * | 9/2008 | Dupuis | .................. | H01L 23/66 375/258 |
| 7,468,547 B2 | 12/2008 | Harvey | | |
| 7,701,731 B2 | 4/2010 | Dhuyvetter et al. | | |
| 7,741,943 B2 | 6/2010 | Fouquet et al. | | |
| 7,768,371 B2 * | 8/2010 | Hui | ..................... | H01F 17/0006 336/200 |
| 7,852,186 B2 * | 12/2010 | Fouquet | ................ | H01F 19/08 336/107 |
| 7,915,992 B2 * | 3/2011 | de Rooij | ............ | H01F 27/2804 324/300 |
| 8,061,017 B2 * | 11/2011 | Fouquet | ................ | H01F 19/08 29/602.1 |
| 8,093,983 B2 * | 1/2012 | Fouquet | ................ | H01F 19/08 257/676 |
| 8,134,817 B2 * | 3/2012 | Carpenter | ............ | H01T 4/08 361/112 |
| 8,188,806 B2 | 5/2012 | Ho et al. | | |
| 8,237,534 B2 * | 8/2012 | Fouquet | ............. | H01F 27/2804 336/200 |
| 8,319,573 B2 * | 11/2012 | Kanschat | ............. | H01F 19/00 333/119 |
| 8,385,043 B2 * | 2/2013 | Ng | ........................ | H01F 19/04 361/268 |
| 8,427,844 B2 * | 4/2013 | Ho | ........................ | H01F 19/08 257/676 |
| 8,436,709 B2 * | 5/2013 | Fouquet | ................ | H01F 19/08 336/200 |
| 8,592,944 B2 | 11/2013 | Santangelo et al. | | |
| 8,772,909 B1 * | 7/2014 | Vinciarelli | ......... | H01F 27/2804 257/531 |
| 9,019,057 B2 * | 4/2015 | Fouquet | ................ | H01F 19/08 336/200 |
| 9,035,422 B2 * | 5/2015 | Khanolkar | ......... | H01F 27/2804 257/531 |
| 9,041,505 B2 * | 5/2015 | Beer | ................... | H01F 27/2804 29/602.1 |
| 9,105,391 B2 * | 8/2015 | Fouquet | ................ | H01F 19/04 |
| 2003/0095026 A1 | 5/2003 | Kawanobe | | |
| 2005/0156699 A1 * | 7/2005 | Hui | .................... | H01F 17/0006 336/200 |
| 2010/0244871 A1 * | 9/2010 | Blair | ................. | G01R 1/07378 324/756.05 |
| 2011/0050292 A1 | 3/2011 | Hui et al. | | |

OTHER PUBLICATIONS

Analog Devices, "ADM2490E: 5 kV Signal Isolated, High Speed (16 Mbps), ESD Protected, Full Duplex RS-485 Transceiver", 2 pages, downloaded Sep. 30, 2011.
Analog Devices, "Coupler® Digital Isolation—Unparalleled Performance and Integration", downloaded Aug. 31, 2011.
Avago Technologies, "Parametric Search: digital Isolator", 2 pages, 2005-2011.
Avago Technologies, "ACML-7400, ACML-7410 and ACML-7420 3.3V/5V 100 MBd High Speed CMOS Digital Isolator", 13 pages, May 16, 2011.
Business Wire, "Analog Devices Introduces First Digital Isolator Packaging that Meets Safety Requirements in Medical and Industrial Applications", www.businesswire.com/news/home/20111005005026/en/anaglog-Devices-Introduc . . . , 3 pages, Oct. 12, 2011.
Hui et al., "Optimal Operation of Coreless PCB Transformer-Isolated Gate Drive Circuits with Wide Switching Frequency Range," IEEE Transactions on Power Electronics, vol. 14, No. 3, 506-514, May 1999.
Hui et al., "Some Electromagnetic Aspects of Coreless PCB Transformers", IEEE Transactions on Power Electronics, vol. 15, No. 4, pp. 805-810, Jul. 2000.
Isolator vs. Optocoupler Technology, Silicon Labs, downloaded Feb. 22, 2013, 21 pages, www.silabs.com/products/power/isolators.
Lee et al., "Multilayer Stacked Coreless Printed Spiral Winding Inductor With Wide Frequency Bandwidth", IEEE Energy Conversion Congress and Exposition, pp. 1002-1009, 2009.
Minteer, Design of a New Transformer-Isolated Analog Acquisition System, IEEE Transactions on Power Delivery vol. 24, No. 3, pp. 1054-1062, Jul. 2009.
Mohan et al., "Power Electronics-Converters, Applications and Design", 2nd Edition, John Wiley and Sons, pp. 708-709, 1995.
NVE Corporation, IL600 Series, 21 pages, Sep. 2010.
NVE Corporation, "Isolator Product Application", 3 pages downloaded Sep. 30, 2011.
Silicon Labs, "Discrete ISOvolt-EVB", 14 pages, Rev. 02 Sep. 2011.
Silicon Labs, "SI84xx Digital Isolators", downloaded Sep. 30, 2011.
Silicon Labs, "SI8410/20/21", 30 pages, Mar. 2011.
Tang et al., "Evaluation of the Shielding Effects on Printed-Circuit-Board Transformers Using Ferrite Plates and Copper Sheets", IEEE Transactions on Power Technology, vol. 17, No. 6, pp. 1080-1088, Nov. 2002.
Texas Instruments, "Application Report ISO72x Digital Isolator Magnetic-Field Immunity", 6 pages Jan. 2006—Revised Feb. 2006.

* cited by examiner

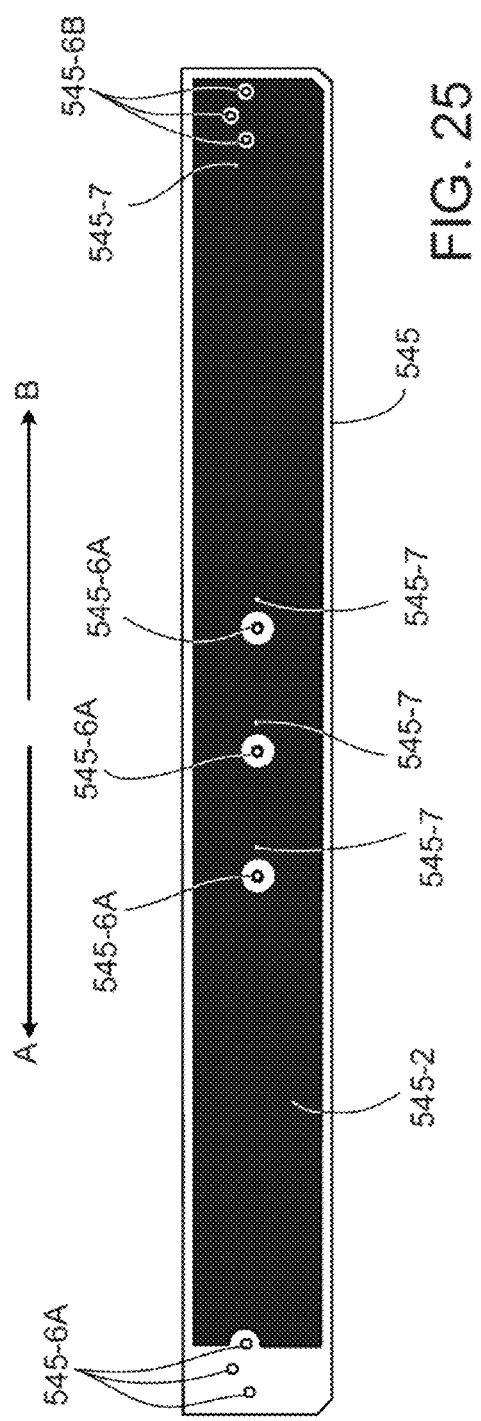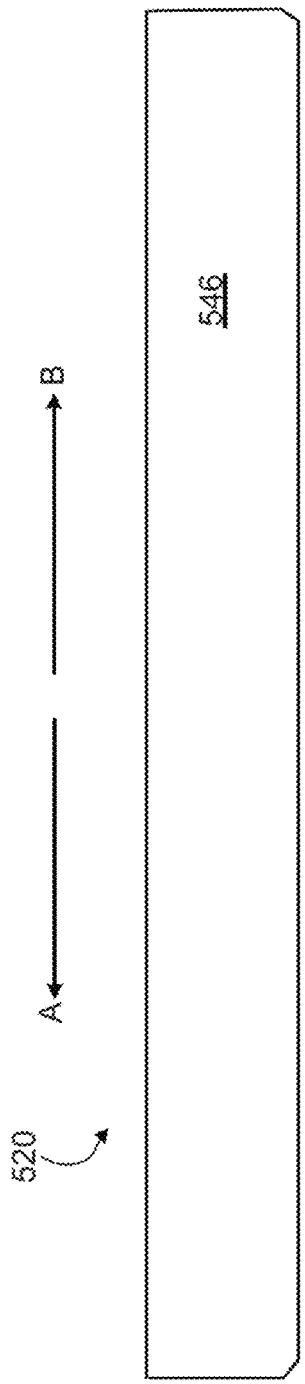

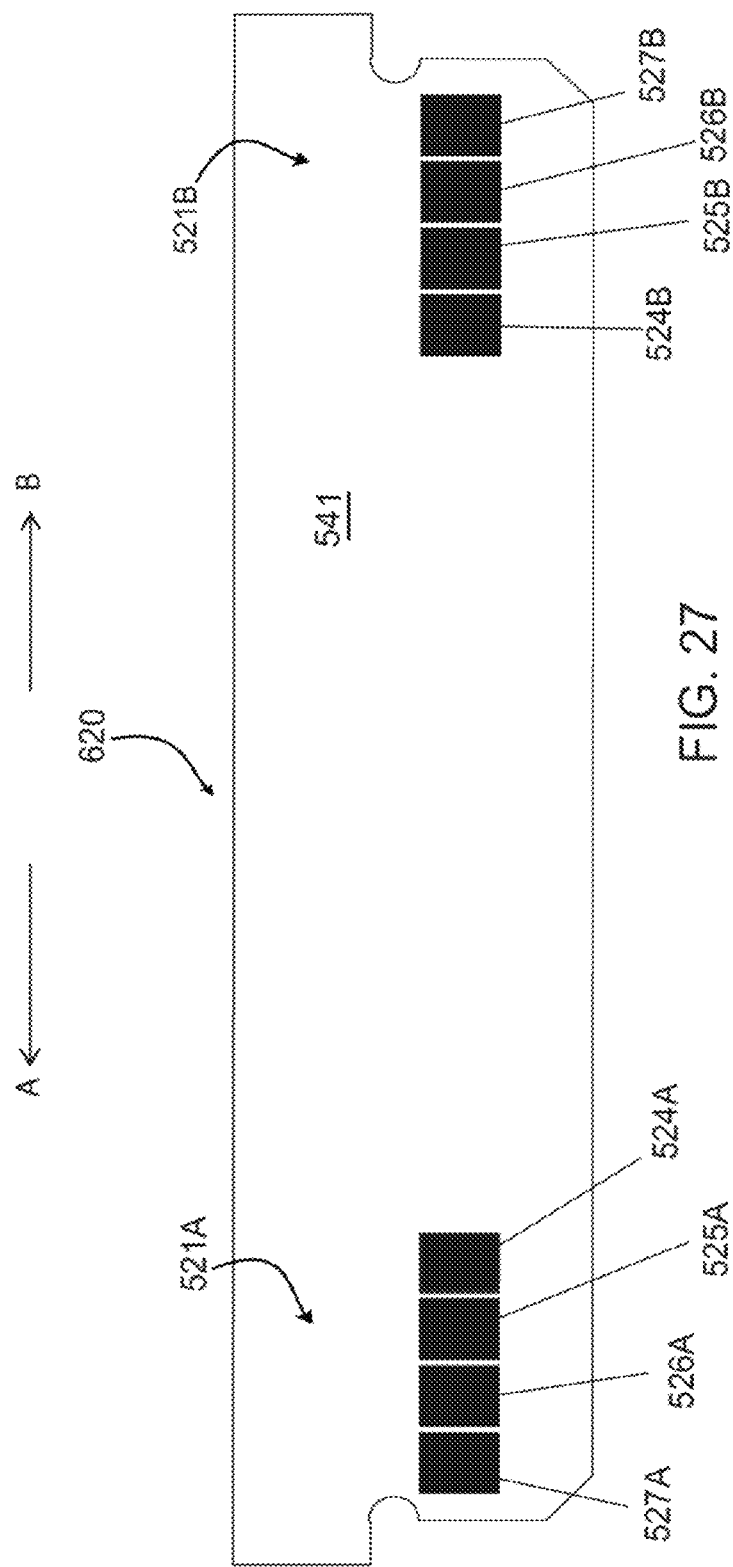

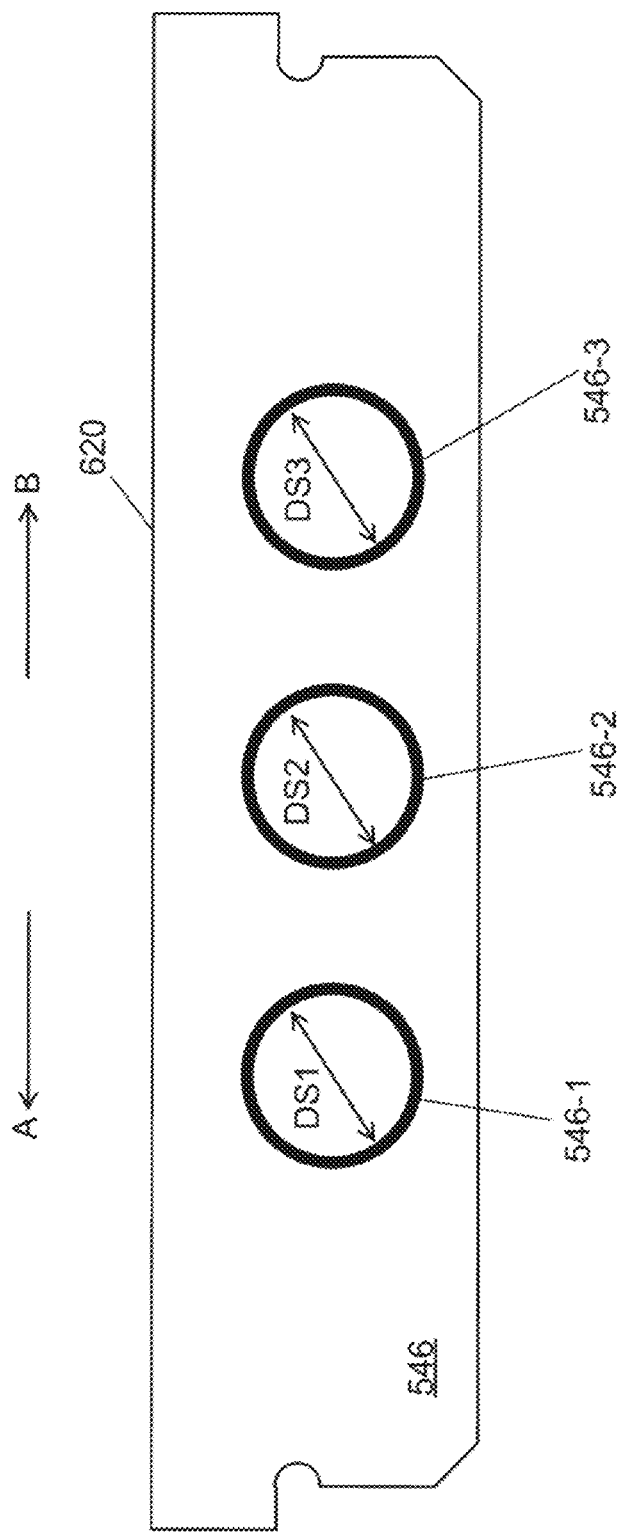

ISOLATOR WITH INTEGRAL TRANSFORMER

CROSS-REFERENCE TO RELATED APPLICATIONS

This application is a continuation-in-part of U.S. patent application Ser. No. 14/289,598, filed on May 28, 2014, which is a continuation application of U.S. patent application Ser. No. 13/645,133, filed on Oct. 4, 2012, issued as U.S. Pat. No. 8,772,909. This application is related to U.S. patent application Ser. No. 14/596,914 titled "Electronic Assemblies Having Components with Edge Connectors," filed on Jan. 14, 2015, and U.S. patent application Ser. No. 14/596,848 titled "Power Adapter Packaging," filed on Jan. 14, 2015. The contents of the above applications are incorporated by reference in their entirety.

TECHNICAL FIELD

This invention relates to apparatus and methods for delivering electrical signals across a magnetically coupled galvanic isolation barrier.

BACKGROUND

Signal isolators, or isolators, as those terms are used herein, are devices that accept an electrical signal via an isolator input port and provide a replica of that signal at an isolator output port, while providing galvanic isolation between the input and output ports. Signal isolators may be used for safety, e.g., to isolate selected portions of a circuit from high voltages in another part of a circuit, and they may be used to minimize or prevent disturbances in one portion of a circuit that might otherwise be caused by normal-mode or common-mode signals in another part of a circuit.

Digital isolators are signal isolators that are optimized for use in transferring digital signals across an isolation barrier. Maintaining digital signal integrity may require that a digital isolator exhibit wide bandwidth to enable transfer of high frequency digital signals with fast rise and fall times, and may also require small input-to-output propagation delay times so that the relative timing of signal transitions on the output side of the isolator closely conforms to the timing of the transitions at the input. Analog isolators are signal isolators that have the ability to transfer analog signals across an isolation boundary. Maintaining analog signal integrity may additionally require that an analog isolator exhibit linearity over a wide bandwidth so that the relative amplitude of the signal on the output side of the isolator closely conforms to the relative amplitude of the signal at the input.

Some isolators use an isolation transformer, e.g. a pair of magnetically coupled insulated windings, to provide the galvanic isolation between the input and output ports. The transformer may be coreless. Analog Devices, Norwood, Mass., USA, for example offers an iCoupler™ product family of digital isolators using chip-scale transformer windings isolated by means of thick polyimide insulation and CMOS integrated circuits that are packaged with, but separate from, the chip-scale transformer, to provide input and output interfaces. Operation of iCoupler products requires user provided primary-side and secondary-side bias-supplies for powering the input and output interface circuitry within the isolator.

Use of a combination of magnetic and copper shields is described in Tang et al, *Evaluation of the Shielding Effects on Printed-Circuit-Board Transformers Using Ferrite Plates and Copper Sheets*, IEEE Transactions on Power Technology, Vol. 17, No. 6, November 2002, pp. 1080-1088. A multilayer coreless inductor with copper shields is described in Lee et al, *Multilayer Stacked Coreless Printed Spiral Winding Inductor with Wide Frequency Bandwidth*, IEEE Energy Conversion Congress and Exposition, 2009, pp. 1002-1009. A transformer having multiple winding layers is described in Kawanobe, *Transformer*, U.S. Patent Application Publication No. US 2003/0095026 A1.

Transfer of digital data across a magnetically isolated barrier using a modulated high frequency carrier is described in Mohan et al, *Power Electronics—Converters, Applications and Design*, $2^{nd}$ Edition, John Wiley and Sons, 1995, pp. 708-709; Haigh et al, *Isolator for Transmitting Logic Signals Across an Isolation Barrier*, U.S. Pat. No. 6,262,600; and Hui et al, *Optimal Operation of Coreless PCB Gate Drive Circuits*, IEEE Transactions on Power Technology, Vol. 14, No. 3, May 1999. Output circuitry powered by energy transferred across the transformer is disclosed in Mohan, supra, and Hui, supra.

SUMMARY

In general, in one aspect, an apparatus that includes a bridge board is provided. The bridge board includes a multilayer printed circuit board having a length, a set of A-side contacts located near an end of the bridge board on a first side of an isolation boundary, the isolation boundary dividing the length, and a set of B-side contacts located on a second side of the isolation boundary near an opposite end of the bridge board, the set of B-side contacts being separated by a predetermined distance from the A-side contacts. The bridge board includes at least one conductive shield, and one or more transformers each transformer including an A-side winding connected to the A-side contacts and a B-side winding connected to the B-side contacts; each A-side winding being galvanically isolated from each B-side contact and each B-side winding; each B-side winding being galvanically isolated from each A-side contact and each A-side winding; each A-side and B-side winding being formed in a respective conductive layer of the bridge board and being located in a region providing space for a magnetic field coupling the primary and secondary windings. The bridge board is constructed and arranged to span a separation distance between an external A-side circuit having a set of A-side terminals and an external B-side circuit having a set of B-side terminals, with the A-side contacts of the bridge board aligned and removably mated with respective ones of the A-side terminals and the B-side contacts of the bridge board aligned and removably mated with respective ones of the B-side terminals. The bridge board provides a galvanically isolated mechanism for connecting the first and second external circuits.

Implementations of the apparatus may include one or more of the following features. The one or more transformers can include a plurality of transformers generally arranged in-line along the length and located in a mid-portion of the bridge board, the A-side windings of the transformers can be formed in one conductive layer of the bridge board, and the B-side windings can be formed in a second conductive layer of the bridge board. The one or more transformers can include three transformers, the A-side windings of the transformers can be formed in one conductive layer of the bridge board, and the B-side windings can be formed in a second conductive layer of the bridge board.

The at least one conductive shield including a first conductive shield can be formed in a third conductive layer and electrically connected to a respective one of the A-side or B-side contacts. The at least one conductive shield including a second conductive shield can be formed in a fourth conductive layer and electrically connected to a respective one of the A-side or B-side contacts. The bridge board can include a fifth conductive layer in which the A side and B-side contacts are formed. The A-side and B-side contacts can be conductive pads exposed on an external surface of the bridge board. The conductive layers of the bridge board can be arranged in the following sequence: third conductive layer, first conductive layer, second conductive layer, fourth conductive layer, and fifth conductive layer. The isolation boundary between the A-side windings and the B-side windings can include a layer of insulating material between the first and second conductive layers.

The at least one conductive shield can include an A-side shield and a B-side shield, and the multi-layer printed circuit board can include the following layers in sequence: a third conductive layer in which the A-side shield is formed; a first conductive layer in which the A-side windings are formed; a second conductive layer in which the B-side windings are formed; a fourth conductive layer in which the B-side shield is formed; a fifth conductive layer in which the A-side and B-side contacts are formed; wherein the conductive layers can be separated from adjacent conductive layers by at least one intervening insulation layer.

The at least one conductive shield can include one or more shorted turns aligned with a respective one of the one or more transformers, and the multi-layer printed circuit board can include the following layers: a first conductive layer in which the A-side windings are formed; a second conductive layer in which the B-side windings are formed; a fifth conductive layer in which the A-side and B-side contacts are formed; a sixth conductive layer in which the one or more shorted turns formed; and wherein the conductive layers are separated from adjacent conductive layers by at least one intervening insulation layer. The sixth conductive layer can be located on an external surface of the PCB. The A-side windings and B-side windings can each include an outer winding diameter, and the one or more shorted turns can each include an outer shorted turn diameter, and the outer shorted turn diameter of each shorted turn can be less than the outer winding diameter of at least one of its respective A-side or B-side winding. A respective one of the one or more shorted turns can be aligned with the A-side winding and B-side winding of each of the one or more transformers.

The apparatus can include a first printed circuit board including the external A-side circuit and a first driver circuit, the first driver circuit having an input for receiving a first input signal from the external A-side circuit and an output connected to the A-side terminals for making electrical connection with a first A-side winding through respective A-side contacts, the first driver circuit being configured to excite the respective A-side winding with a first frequency; the external B-side circuitry separated from the external A-side circuitry by the separation distance; a first detector circuit located near the external B-side circuit, the first detector circuit having an output for providing an output signal to the external B-side circuit and an input connected to the B-side terminals for making electrical connection with a first B-side winding through respective B-side contacts, the first detector circuit being configured to selectively sense the first frequency and provide the output signal in response to the first driver circuit exciting the first A-side winding with the first frequency.

The external B-side circuit and the first detector circuit can be located on a second printed circuit board. The external B-side circuit and the first detector circuit can be located on the first printed circuit board.

The apparatus can include a power processing module having input terminals, output terminals, and a length, a width, and a height; wherein the power processing module can be arranged between the first printed circuit board and the second printed circuit board and the bridge board can be arranged alongside the power processing module extending between the first circuit board and the second printed circuit board.

In some examples, the bridge board can be substantially perpendicular to the first or second PCB. In some examples, the bridge board and the first or second PCB can form an oblique angle. The first and second PCBs can be substantially parallel to each other.

The apparatus can include a first driver circuit including at least one electronic component mounted to a surface of the bridge board on the A-side of the isolation boundary, the first driver circuit having an input connected to the A-side contacts for receiving an input signal from the external A-side circuit and an output connected to the A-side winding of a first one of the one or more transformers to excite it with a first frequency.

The apparatus can include a first detector circuit including at least one electronic component mounted to a surface of the bridge board on the B-side of the isolation boundary, the first detector circuit having an input connected to the B-side winding of a first of the one or more transformers and an output connected to the B-side contacts for providing an output signal to the B-side external circuit.

The apparatus can includes a first driver circuit including at least one electronic component mounted to a surface of the bridge board on the A-side of the isolation boundary, the first driver circuit having an input connected to the A-side contacts for receiving an input signal and an output connected to the A-side winding of a first of the one or more transformers for stimulating the A-side winding with a first frequency; and a first detector circuit including at least one electronic component mounted to a surface of the bridge board on the B-side of the isolation boundary, the first detector circuit having an input connected to the B-side winding of the first transformer and an output connected to the B-side contacts for providing an output signal, the first detector circuit being configured to selectively sense the first frequency and provide the output signal in response to the first driver circuit exciting the first transformer with the first frequency.

The at least one component of the driver circuit and the at least one component of the detector circuit can be mounted to the same surface of the bridge board. In some examples, the A-side contacts and B-side contacts can be located on the same surface of the bridge board. In some examples, the A-side contacts and B-side contacts can be located on opposite surfaces of the bridge board. The A-side or B-side terminals can include contact fingers configured to mate with respective A-side or B-side contacts on the bridge board. The first PCB can be positioned within a first plane and the bridge board can be positioned within a second plane at an angle to the first plane. The angle can be approximately 90 degrees.

The conductive shield can include a conductive material applied to a surface of the multilayer printed circuit board. The A-side or B-side terminal can include contact fingers configured to mate with respective A-side or B-side contacts on the bridge board and the bridge board can include a contour including at least one feature adapted to form a predetermined alignment between the bridge board and the first PCB.

The first driver circuit can include an oscillator powered exclusively by power received from the first input signal. The first detector circuit can be powered exclusively by power received from the first B-side winding. The first detector circuit can be powered exclusively by power received from the first driver circuit through the first transformer, and the first driver circuit is powered exclusively by power received from the first input signal.

The first driver circuit can include an oscillator adapted to excite the first A-side winding with amplitude modulated as a function of the first input signal. The first detector circuit can be adapted to provide an analog output signal having an amplitude that is a function of the amplitude of the excitation. The first detector circuit can include an open-collector output. The first detector circuit can sink a current as the output signal. The first detector circuit can be adapted to provide a binary output signal having a state that is a function of the presence or absence of the excitation. The first detector circuit can sink a current as the output signal. The region between the first and second conductive shields can be free of magnetically permeable material.

The one or more transformers can be loosely coupled. In some examples, the one or more transformers can be characterized by a coupling coefficient between the windings that is less than 60%. In some examples, the transformer can be characterized by a coupling coefficient between the windings that is less than 35%.

The one or more transformers can include a first transformer and a second transformer, respectively includes first and second A-side and B-side windings; the at least one conductive shield can be formed in one or more conductive layers of the multi-layer printed circuit board; and the apparatus can further include: a first printed circuit board including the external A-side circuit and A-side terminals; a second printed circuit board including the external B-side circuit and B-side terminals; the second printed circuit board being separated by a first distance from the first printed circuit board; a first driver circuit having an input for receiving a first input signal from the external A-side circuit and an output connected to the first A-side winding, the first driver circuit being configured to excite the first A-side winding with a first frequency; a first detector circuit having an output for providing an output signal to the external B-side circuit and an input connected to the first B-side winding, the first detector circuit being configured to selectively sense the first frequency and provide the output signal in response to the first driver circuit exciting the first A-side winding with the first frequency; a second driver circuit having an input for receiving a second input signal from the external B-side circuit and an output connected to the second B-side winding, the second driver circuit being configured to excite the second B-side winding with a second frequency; and a second detector circuit having an output for providing an output signal to the external A-side circuit and an input connected to the second A-side winding, the second detector circuit being configured selectively to sense the second frequency and provide the output signal in response to the second driver circuit exciting the second B-side winding with the second frequency.

The first driver and second detector can be located on the first PCB and the second driver and the first detector can be located on the second PCB. The first and second drivers and the first and second detectors can be located on the multilayer printed circuit board. The first driver circuit can be powered exclusively by power received from the first input signal. The first detector circuit can be powered exclusively by power received through the first transformer.

In general, in another aspect, an apparatus that includes a bridge board is provided. The apparatus includes an A-side printed circuit board having a set of A-side terminals; a B-side printed circuit board having a set of B-side terminals; and a bridge board that includes a multilayer printed circuit board (PCB) having a set of A-side contacts located near a first end of the bridge board, and a set of B-side contacts located near a second end of the bridge board, the set of B-side contacts being separated by a distance from the A-side contacts, the A-side contacts of the bridge board aligned and removably mated with respective ones of the A-side terminals, the B-side contacts of the bridge board aligned and removably mated with respective ones of the B-side terminals. The bridge board includes at least one conductive shield, an A-side winding connected to the A-side contacts, and a B-side winding connected to the B-side contacts. The A-side winding is galvanically isolated from the B-side contacts and the B-side winding, and the B-side winding is galvanically isolated from the A-side contacts and the A-side winding. Each A-side and B-side winding is formed in a respective conductive layer of the bridge board and located in a region providing space for a magnetic field coupling the A-side winding and the B-side winding.

Implementations of the apparatus may include one or more of the following features. The A-side circuit board can include a driver circuit, the driver circuit can have an input for receiving an input signal from an external A-side circuit and an output connected to the A-side terminals for making electrical connection with the A-side winding through respective A-side contacts, and the driver circuit can be configured to excite the A-side winding with a first frequency. The B-side circuit board can include a detector circuit having an output for providing an output signal to an external B-side circuit and an input connected to the B-side terminals for making electrical connection with a B-side winding through respective B-side contacts, and the detector circuit can be configured to selectively sense the first frequency and provide the output signal in response to the driver circuit exciting the A-side winding with the first frequency.

The apparatus can include a power processing module having input terminals and output terminals, in which the power processing module can be arranged between the A-side circuit board and the B-side circuit board, and the bridge board can be arranged alongside the power processing module extending between the A-side circuit board and the B-side circuit board. The A-side circuit board and the B-side circuit board can be connected as an integral piece. The at least one conductive shield can include one or more shorted turns formed in a conductive layer of the PCB and aligned with at least one of the A-side or B-side winding, and the region is bounded on at least one end by the one or more shorted turns. The at least one conductive shield can include a first conductive shield formed in a conductive layer of the PCB and a second conductive shield formed in a conductive layer of the PCB, and the region can be bounded between the first and second conductive shields.

In general, in another aspect, a method of providing galvanic isolation for one or more signals is provided. The method includes providing a bridge board for supporting isolator circuitry, the bridge board including a substrate and a plurality of parallel conductive layers separated by insulation, the bridge board having an A-side winding in a first conductive layer of the substrate and a B-side winding in a second conductive layer of the substrate; coupling the bridge board to an A-side circuit board that has a driver circuit having an input for receiving an input signal and an output electrically coupled to the A-side winding; coupling the bridge board to a B-side circuit board that has a detector circuit having an input for receiving a signal from the B-side winding; exciting, using the driver circuit, the A-side winding at a first frequency in response to the input signal; selectively sensing, using the detector circuit, the first frequency at the B-side winding; and providing an output signal at an output of the B-side circuit board in response to sensing the first frequency.

Implementations of the method may include one or more of the following features. Exciting the A-side winding at a first frequency can include exciting the A-side winding at a first frequency using power derived from the input signal. Providing an output signal can include providing an output signal at an output of the B-side circuit board using power derived from the B-side winding. The method can include providing one or more shorted turns to create a region for the windings to reduce effects from extraneous magnetic fields. The method can include providing one or more conductive shields to create a region for the windings to reduce effects from extraneous magnetic fields.

In general, in another aspect, a method of providing galvanic isolation for one or more signals is provided. The method includes using a driver circuit on an A-side circuit board to drive an A-side winding in a bridge board coupled to the A-side circuit board at a first frequency, the bridge board having A-side contacts that are removably coupled to A-side terminals on the A-side circuit board, the A-side contacts being electrically coupled to the A-side winding; using a detector circuit on a B-side circuit board to selectively sense the first frequency at a B-side winding in the bridge board, the bridge board having B-side contacts that are removably coupled to B-side terminals on the B-side circuit board, the B-side contacts being electrically coupled to the B-side winding; and generating an output signal at an output of the B-side circuit board in response to sensing the first frequency.

Implementations of the method may include one or more of the following features. Exciting the A-side winding at a first frequency can include exciting the A-side winding at a first frequency using power derived from an input signal received at an input of the A-side circuit board. Providing an output signal can include providing an output signal at an output of the B-side circuit board using power derived from the B-side winding.

Other aspects include other combinations of the features recited above and other features, expressed as methods, apparatus, systems, and in other ways.

DESCRIPTION OF DRAWINGS

FIGS. 21 to 25 show diagrams of patterned conductive layers of the bridge board.

FIG. 26 shows a diagram of a surface of the bridge board.

FIGS. 27 to 32 show diagrams of patterned conductive layers of an alternate embodiment of the bridge board.

Like reference symbols in the various drawings indicate like elements.

DETAILED DESCRIPTION

Isolator Functional Overview

Figure 9:
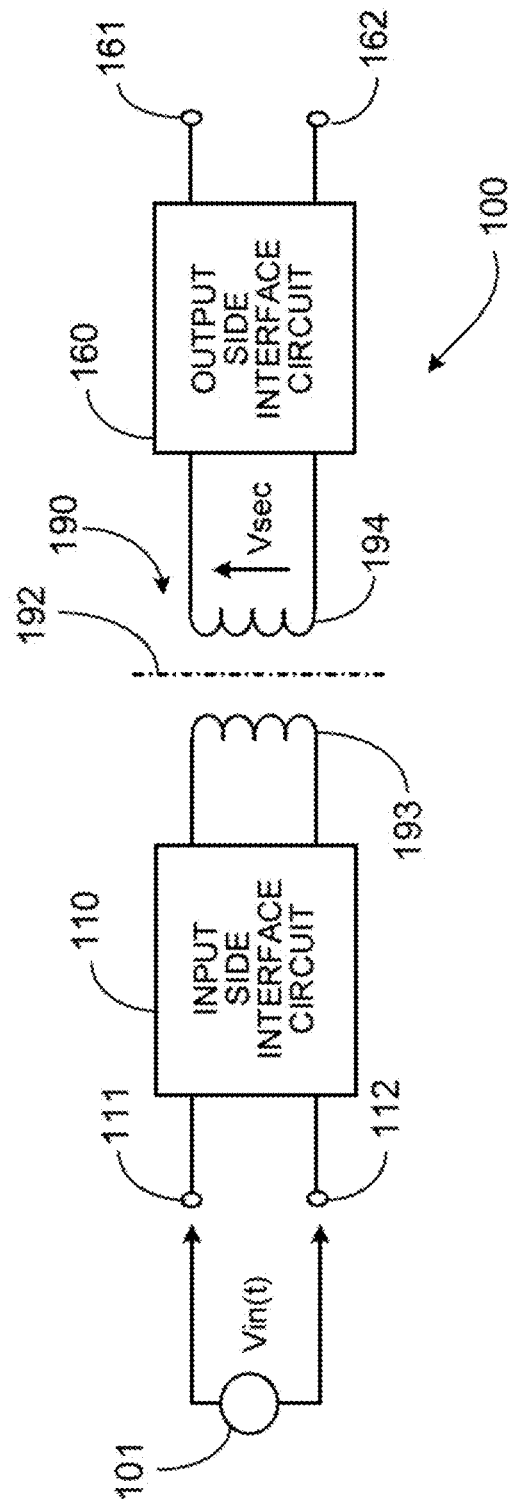
FIG. 9 is a block diagram of a single isolator channel.
Figure 10:
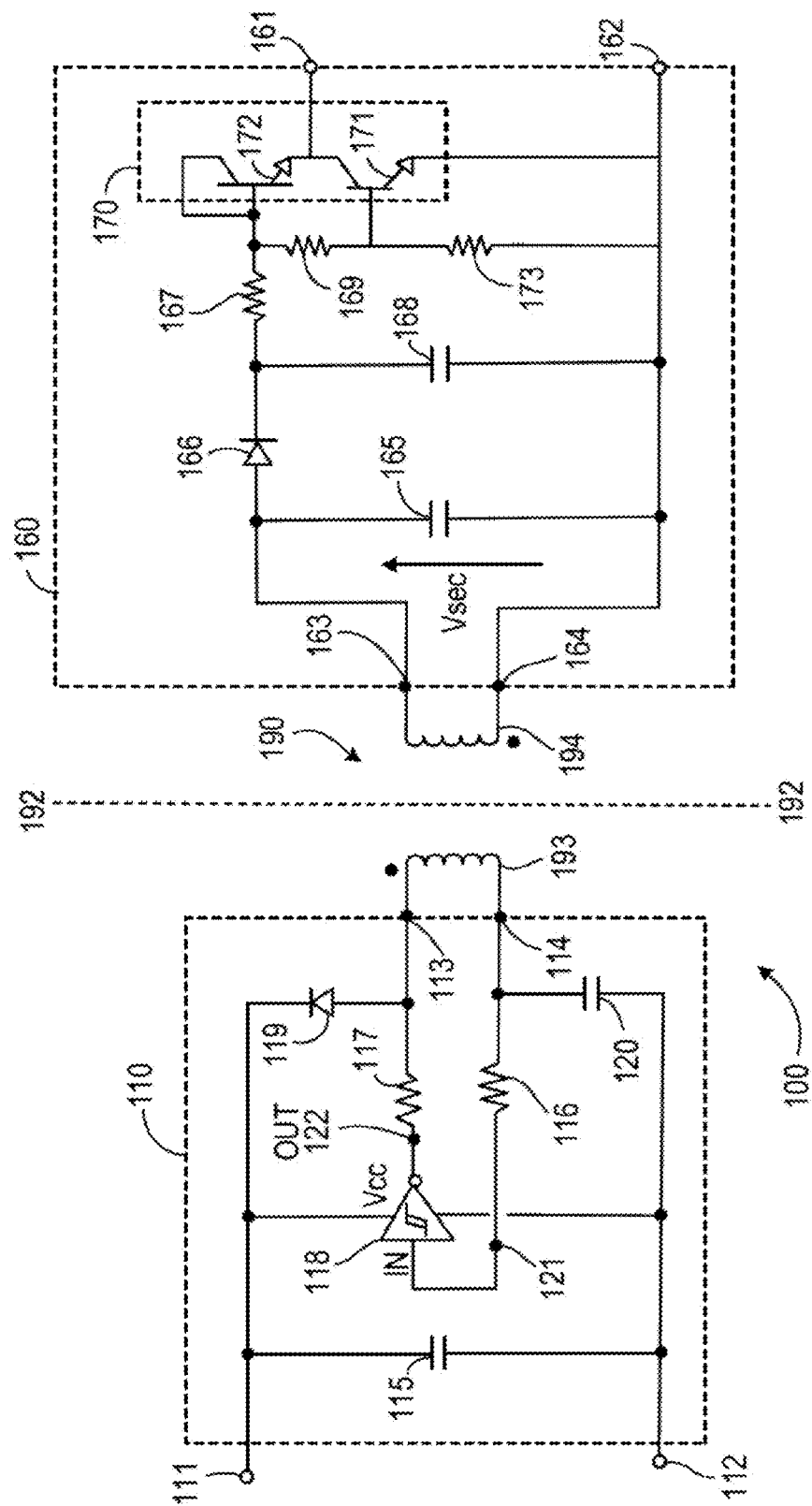
FIG. 10 is a schematic diagram of a single isolator channel.

Referring to FIG. 9, an electrical block diagram of a single channel isolator 100 is shown including an isolation boundary 192 bridged by a transformer 190 having a primary winding 193 on one side and a secondary winding 194 on the other side of the isolation boundary 192. The isolator 100 includes input-side interface circuitry 110 for receiving an input signal 101 and driving the primary winding 193, and output-side interface circuitry 160 for receiving a signal 161 from the secondary winding 194 and delivering an output signal 102 representative of the input signal to circuitry external to the isolator (not shown). One implementation of the single channel isolator is shown in the schematic of FIG. 10. The transformer 190 provides a medium for communication across the isolation boundary while preserving galvanic isolation between the input signal 101 and the output signal 102. Each transformer winding, as well as its respective interface circuitry, is electrically isolated from its counterpart on the opposite side of the isolation boundary 192 as shown in FIG. 9. Power for operating the input-side circuitry 110 may be derived from the input signal 101 and power for operating the output-side circuitry 160 may be derived from the signal delivered by the secondary winding as shown in the block diagram of FIG. 9 by the absence of separate power connections to the isolator 100.

Isolator Assembly

Figure 1:
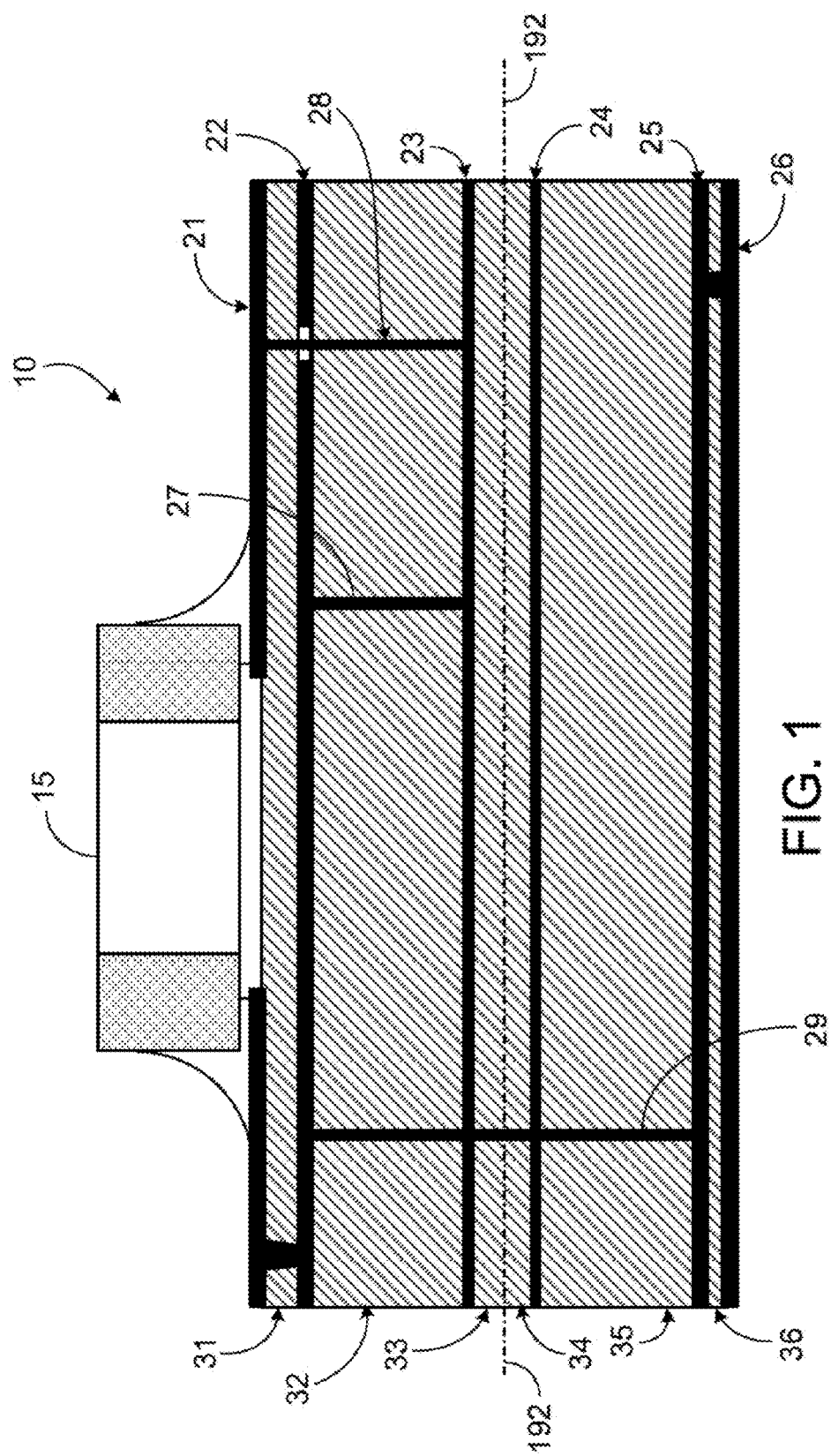
FIG. 1 is a cross-section showing construction details of a multilayer isolator.
Figure 2:
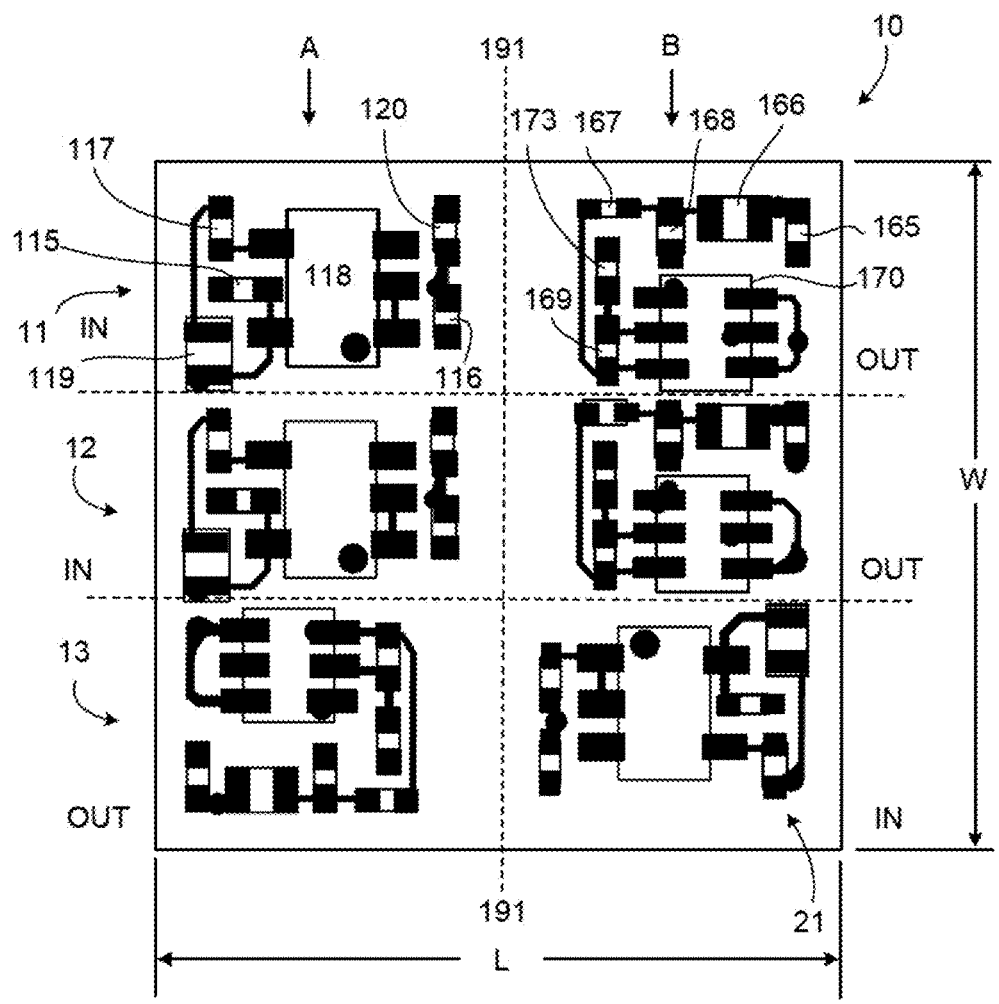
FIG. 2 is a top plan view showing a top conductive layer of a multichannel isolator.
Figure 6:
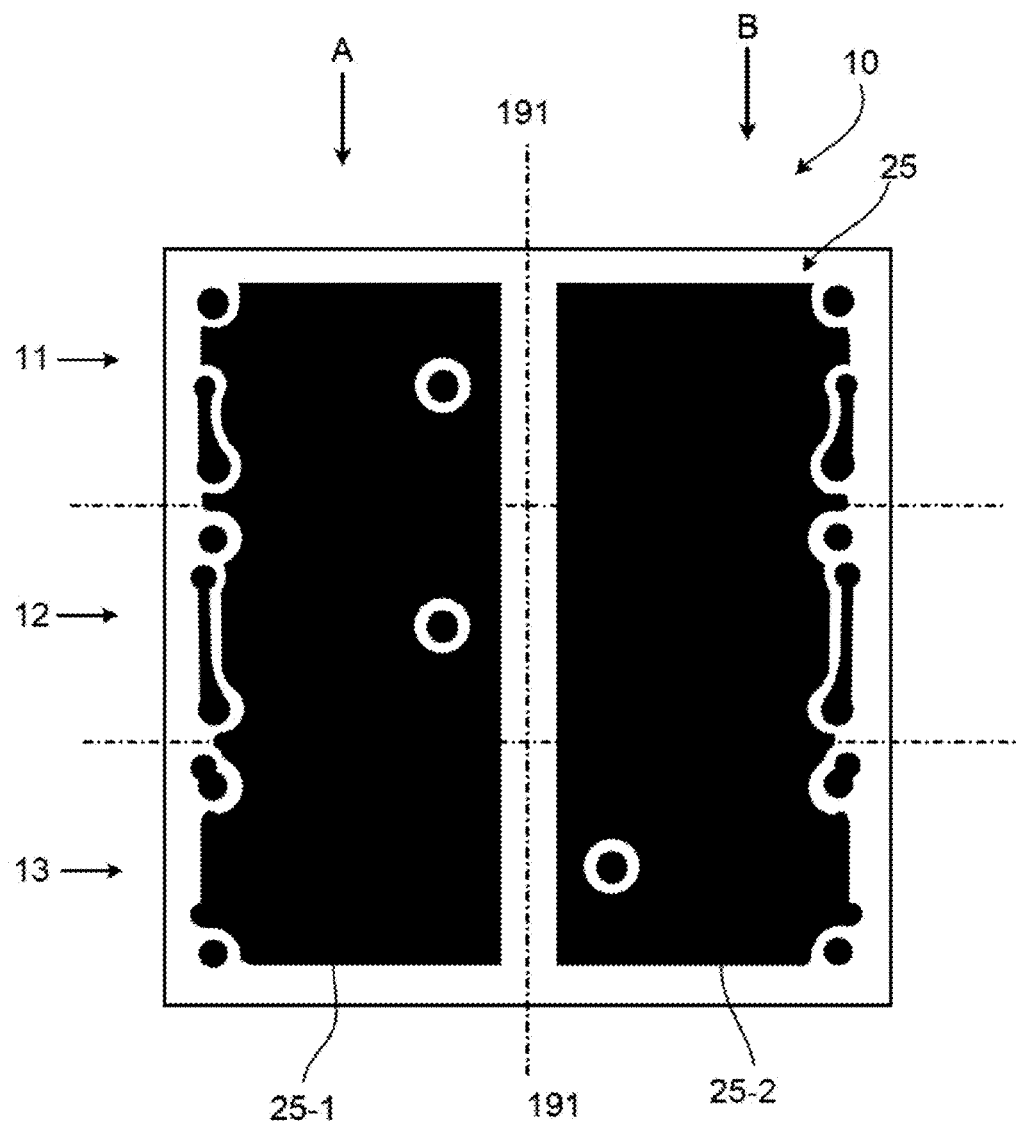
FIG. 6 is a plan view showing a lower inner conductive shield layer of a multichannel isolator.
Figure 7:
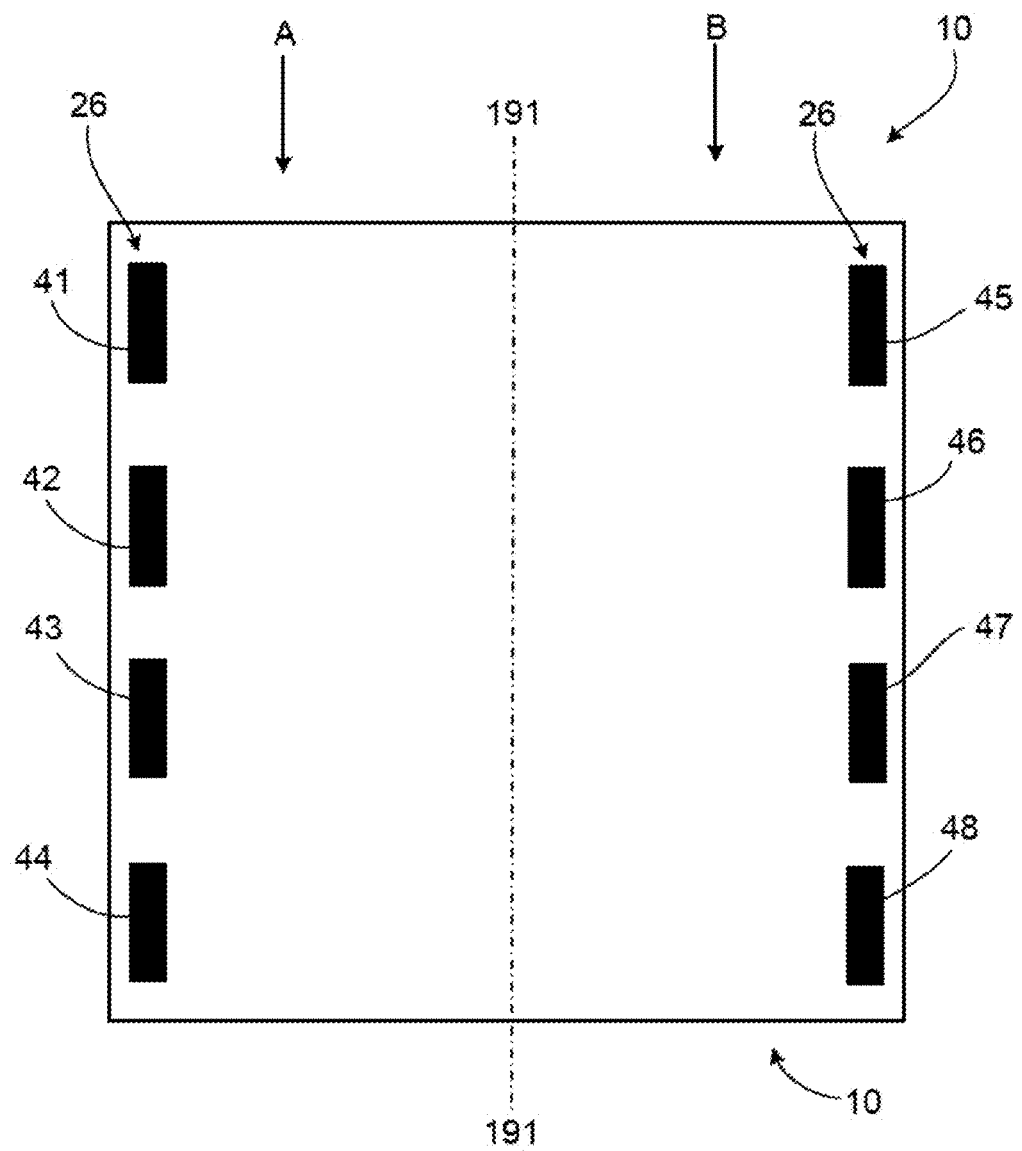
FIG. 7 is a plan view showing a bottom conductive layer of a multichannel isolator.
Figure 8:
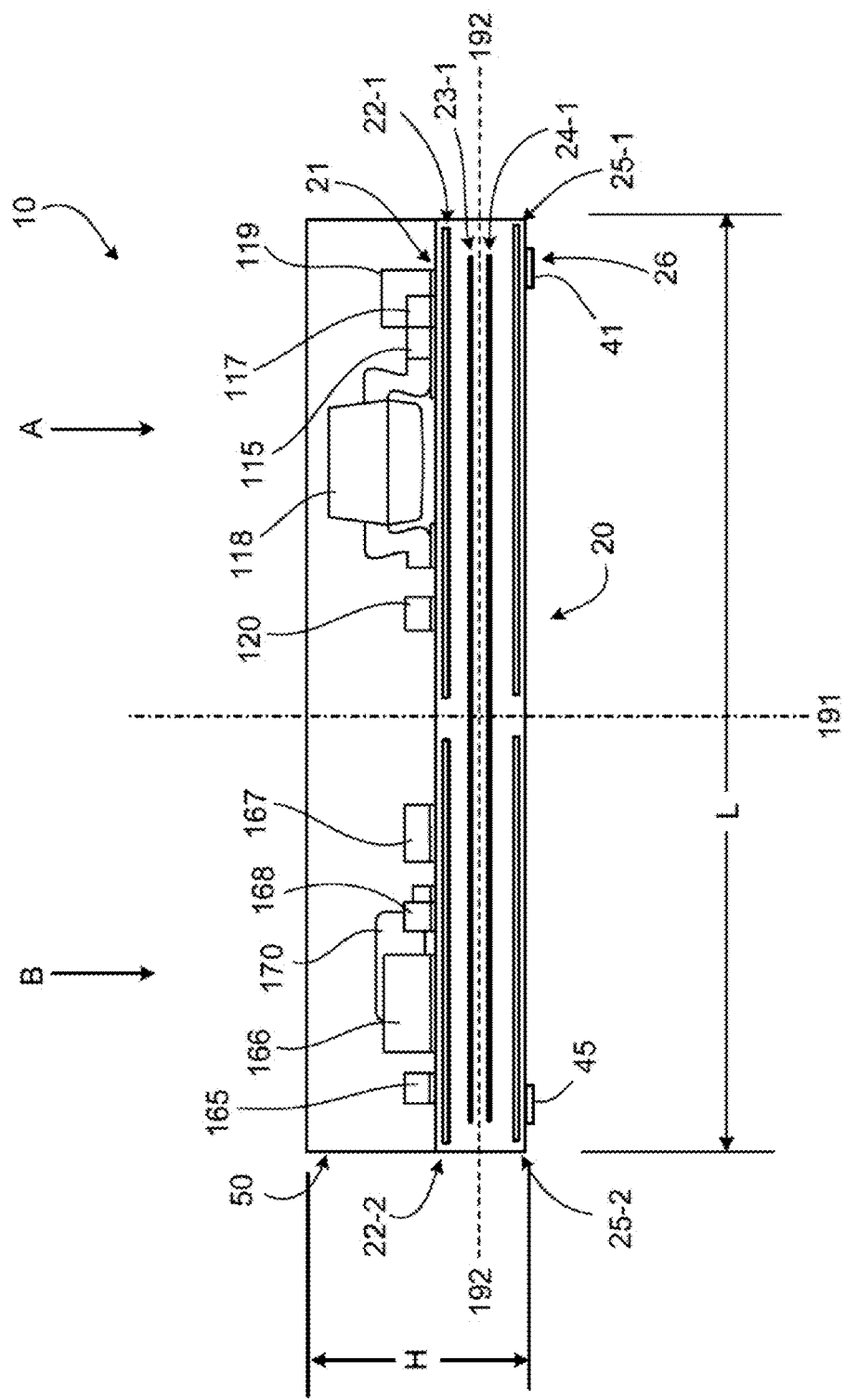
FIG. 8 is a side view showing a section of a multichannel isolator.

Referring generally to FIGS. 1 through 8, the construction of an isolator 10 incorporating three independent single channel isolators, such as single channel isolator 100 shown in the block diagram of FIG. 9 and in the schematic diagram of FIG. 10, may be formed as shown in FIG. 8 on a multilayer substrate 20 and encapsulated as a system in a package. Each isolator channel 11, 12, 13, has an input which receives an input signal and an output that delivers an output signal that is isolated from and representative of its input. As shown in FIG. 2, signal flow through the first isolator 11 and the second isolator 12 is from left to right, whereas the signal flow through the third isolator 13 is from right to left. Thus, the illustrated arrangement of the three isolators allows for isolated transmission of two digital signals in one direction and isolated transmission of a third digital signal in the opposite direction. The substrate 20, in addition to providing electrical interconnections, mounting support for the electronic components, and terminations for connection to external circuitry, may include an integral shielded transformer formed in the inner layers of the substrate. The cross-sectional views of FIGS. 1 and 8 show an arrangement of the plurality of alternating conductive and insulating layers of the isolator substrate 20. Top plan views of each of six conductive layers, 21 through 26, are provided in FIGS. 2 through 7, respectively which also include component placement details and connections on the top and bottom conductive layers. The isolator 10 may be constructed as shown on a substrate that is 10 mm (0.394 in) long, L, and 10 mm (0.394 in) wide, W as shown in FIG. 2 and have an overall height of 2.4 mm (0.095 in) as shown in FIG. 8.

Substrate Structure

Figure 4:
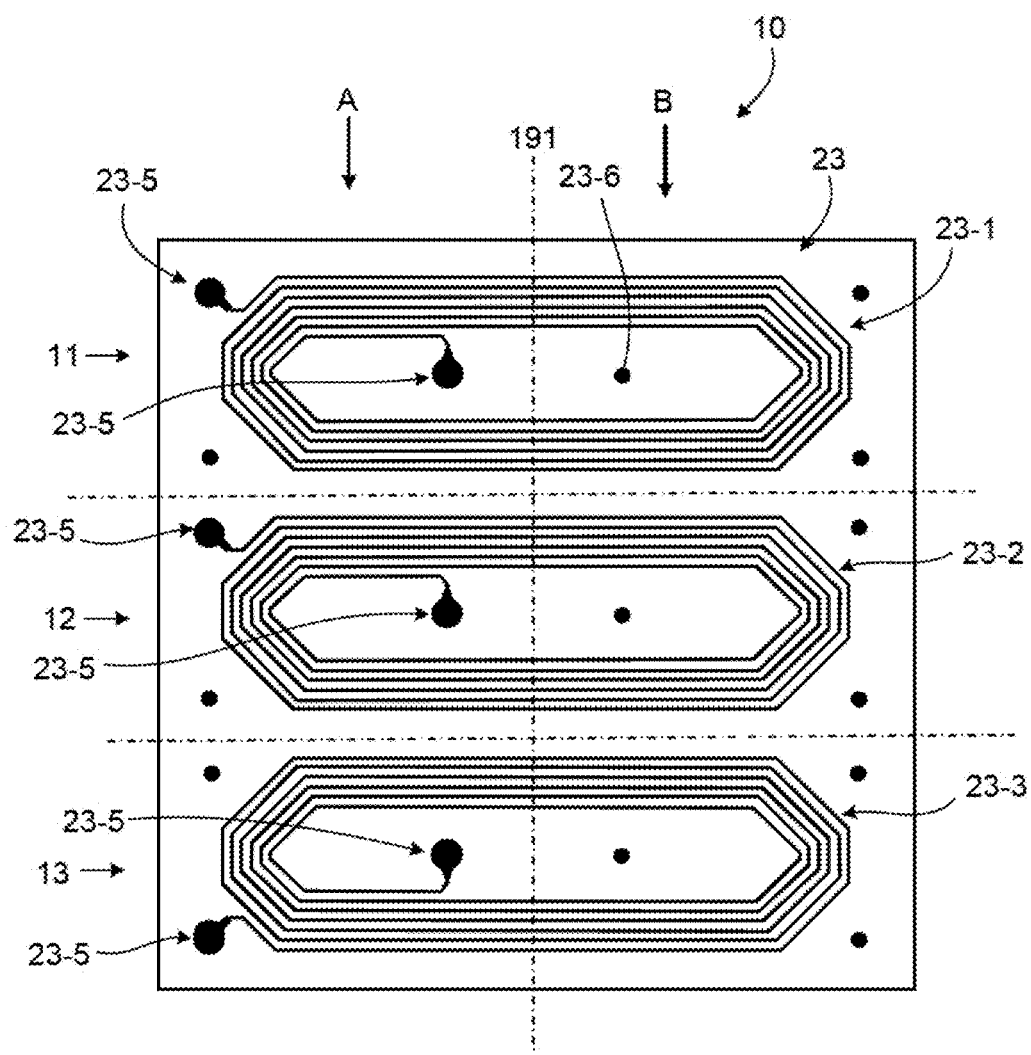
FIG. 4 is a plan view showing an upper inner conductive winding layer of a multichannel isolator.
Figure 5:
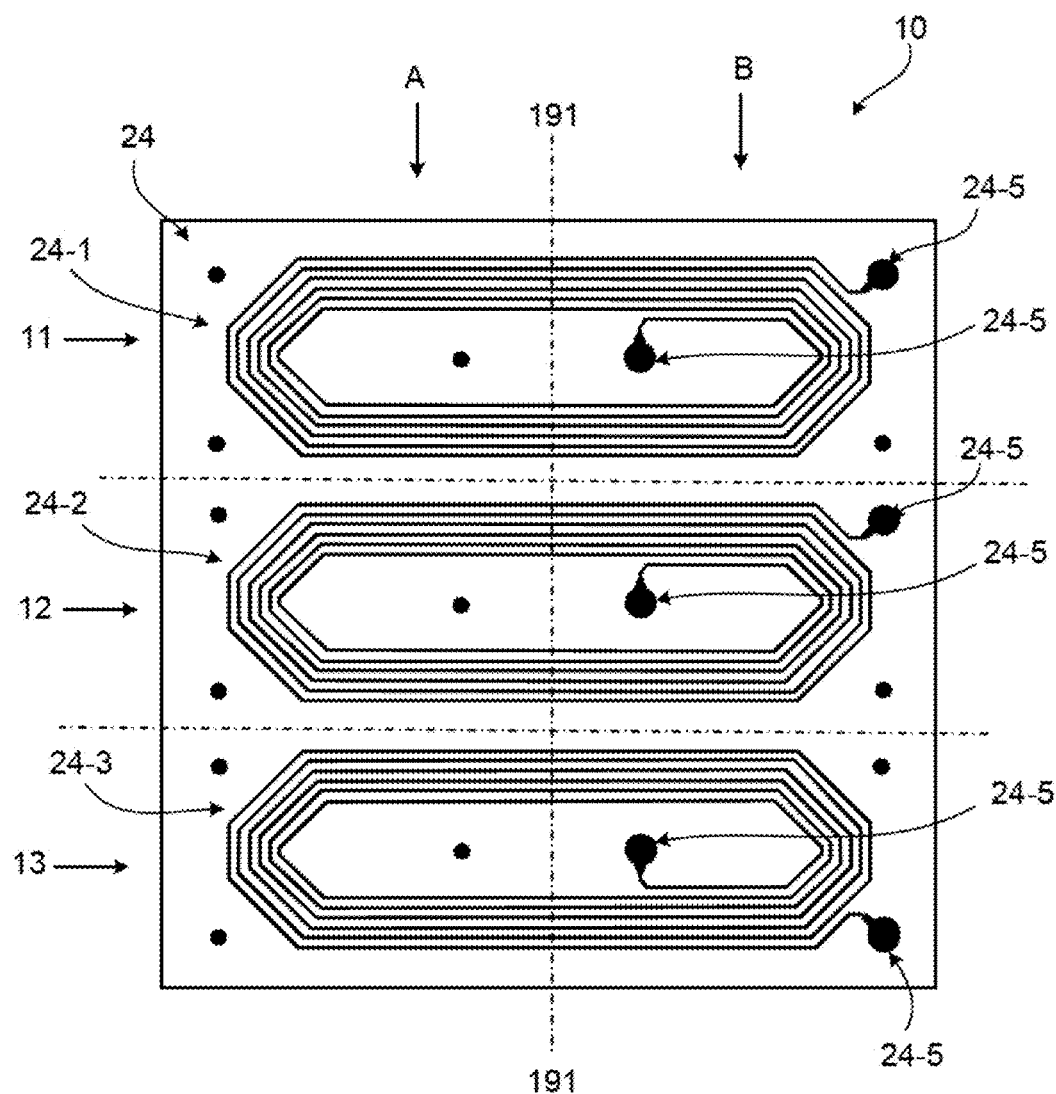
FIG. 5 is a plan view showing a lower inner conductive winding layer of a multichannel isolator.

The isolator assembly 10 includes a multilayer substrate 20, such as a printed circuit board ("PCB"), which as shown in the cross-sectional view of FIG. 1 (and in FIG. 8) may include six conductive layers 21, 22, 23, 24, 25, and 26, separated by at least one intervening insulation layer. Starting from the component-side of the substrate 20 (the top in the cross-section of FIG. 1), the first (top) conductive layer 21 may be used to form circuit interconnections and pads onto which the electrical components (such as component 15 in FIG. 1) may be placed as shown in the plan view of FIG. 2 preferably using surface mount solder techniques. A second inner conductive layer 22 (FIG. 3) may be used to form an upper shield over the transformer windings which may be formed in the third and fourth inner conductive layers 23, 24 (FIGS. 4, 5). The fifth inner conductive layer 25 may be used to form a lower shield (FIG. 6) beneath the transformer windings (conductive layers 23, 24). A sixth (bottom) conductive layer 112 may be used to form interconnection terminals 41-48 as shown in the plan view of FIG. 7.

The substrate 20 may include insulating layers between the conductive layers as shown in FIG. 1: a first insulating layer 31 located between the top conductive layer 21 and the second inner conductive layer 22; a second insulating layer 32 located between the second inner conductive layer 22 and the third inner conductive layer 23; a third insulating layer 33 and an optional fourth insulating layer 34 as shown, arranged one on top of the other and located between the third inner conductive layer 23 and the fourth inner conductive layer 24; a fifth insulating layer 35 located between the fourth inner conductive layer 24 and the fifth inner conductive layer 25; and a sixth insulating layer 36 located between the fifth inner conductive layer 25 and the sixth bottom conductive layer 26.

Conductive paths or vias may pass vertically through one or more insulating layers of the substrate to create a connection, or connections, between two or more conductive layers as is well known in the multilayer printed circuit board art. For example, conductive via 27 is shown connecting a portion of conductive layer 22 to a portion of conductive layer 23; conductive via 28 is shown connecting a portion of layer 21 to a portion of layer 23 passing through conductive layer 22 without making a connection to it; via 29 is shown connecting a portion of layer 22 to portions of layers 23, 24 and 25.

Note that the multilayer stack-up shown in the cross-sectional view of FIG. 1 is illustrative of the general arrangement of the layers and the mechanisms for making connections but does not show details of how the conductive layers are patterned, does not reflect the specific circuit connections as shown for example in the conductive layer plan views or the schematic diagrams, and is not drawn to scale. In one embodiment, the substrate 20 may be a multilayer printed circuit board ("PCB") comprising in nominal dimensions: a 0.0018" thick copper first top layer; a 0.002" thick copper second inner layer; a 0.0007" thick copper third inner layer; a 0.0007" thick copper fourth inner layer; a 0.002" thick copper fifth inner layer; a 0.0018" thick copper sixth bottom layer; a first insulating layer comprising 0.004" thick pre-preg material; a second insulating layer comprising 0.021" thick fiberglass core material; the third and fourth insulating layers comprising a 2-ply pre-preg material having a total thickness of 0.010"; a fifth insulating layer comprising 0.021" thick fiberglass core material; and a sixth insulating layer comprising 0.004" thick pre-preg material.

Isolation Boundaries

In the top plan view of FIG. 2, the isolator 10 is shown divided into three isolator channels, first channel 11, second channel 12, and third channel 13. Applications requiring isolators typically require separation and isolation between the two sides of the isolator and the external circuitry to which it may be connected by specified minimum distances and breakdown voltage ratings. The isolator 10 is accordingly divided along an isolation boundary 192 shown in FIG. 2 separating each of the three channels into an A-side and a B-side. For clarity, two reference designations 191 and 192 are used for different physical and structural aspects of the isolation boundary 192 shown schematically in FIG. 9. The isolation boundary 191 shown in FIGS. 2 through 8 represents lateral separation of the A-side and B-side components and conductors by a predetermined distance and includes the physical structure of the insulation layers of the substrate and the encapsulant in the system in a package as shown in FIG. 8. The isolation boundary 192 of FIGS. 1 and 8 (transformer isolation 192 in FIGS. 9 and 10) represents a vertical separation between the planes of conductive layers 23 and 24 (used for the transformer windings) and includes the physical structure of insulation layers 33 and 34. Isolation breakdown voltages greater than 5,000 Volts have been achieved in the illustrated example. The combination of these features will be discussed in greater detail in connection with the transformer and shield structures below.

Transformer Winding Structure

Each isolator channel (11, 12, 13) of isolator 10 includes a respective independent transformer (190 FIG. 9) which may be formed in the substrate 20. Each transformer includes two windings, one primary winding 193 (FIG. 9) on the input side and one secondary winding 194 (FIG. 9) on the output side of the isolation boundary 191. The isolator example shown in FIG. 2 is arranged with two isolator channel (11, 12) inputs and one isolator channel (13) output on the A-side (left) of the isolation boundary 191, providing communication from the A-side to the B-side in two channels (11, 12) and in the reverse direction from the B-side to the A-side in one channel (13). The windings of each transformer may preferably be formed in adjacent inner conductive layers, e.g., as shown in the side view of isolator 10 in the region of channel 11 provided in FIG. 8.

To promote magnetic coupling between the windings, the primary and secondary windings of each transformer preferably may be positioned in an overlying arrangement while being separated from each other by one or more insulation layers providing a galvanic isolation barrier 192 (FIGS. 1, 8). In the example of FIGS. 1-8, the innermost conductive layers, 23 and 24, have been dedicated for the transformer windings. These two conductive layers are separated by the isolation boundary 192 which as shown in FIGS. 1, 8 includes insulation layers 33 and 34. Accordingly, all A-side transformer windings are shown formed in layer 23 (FIG. 4) and all B-side windings are shown formed in layer 24 (FIG. 5). The isolation boundary 192 in FIGS. 1, 8 between the transformer windings preferably includes two insulation layers to reduce the likelihood that defects in the insulating layers would provide a shorting path between the windings. Accordingly, with the arrangement shown in FIG. 2 (channel 11 input, channel 12 input, and channel 13 output on the A-side), the primary windings (193, FIG. 9) of channels 11 and 12 and the secondary winding (194, FIG. 9) of channel 13 are shown formed in conductive layer 23 (A-side) in FIG. 4. Similarly the matching windings (secondary windings of channels 11 and 12 and the primary winding of channel 13) are shown formed in conductive layer 24 (B-side) in FIG. 5. Preferably, the terminations of the windings formed in layer 23 are provided on the A-side and the terminations of the windings formed in layer 24 are provided on the B-side of the substrate 20. FIG. 4 shows the three A-side windings 23-1, 23-2, 23-3 formed in conductive layer 23 with terminations 23-5 located on the A-side of the isolation boundary 191. Similarly, FIG. 5 shows the three B-side windings 24-1, 24-2, 24-3 formed in conductive layer 24 with terminations 24-5 located on the B-side of the isolation boundary 191. The winding terminations may be aligned to form connections with the other circuitry or terminals using conductive vias (e.g., vias 27 and 28; FIG. 1). The transformers may be constructed as shown without magnetically permeable cores.

Transformer Shield Structure

Interference in the core-less transformer structure may be reduced by providing one or more shields for the windings. In the example of isolator 10, two conductive shield layers are shown: a top shield layer 22 (FIG. 3) positioned above the transformer windings (the next conductive layer above the A-side windings) and a bottom shield layer 25 (FIG. 6) positioned below the transformer windings (the next conductive layer below the B-side windings). Note that the insulation layers between the shields and the windings are somewhat thicker providing space for the magnetic fields around the transformer windings.

The shield layers 22, 25, separated as shown in FIGS. 1 and 8 from the windings by insulating layers 32, 35, define a region in the substrate 20 within which the transformer windings may be situated and may act as eddy current shields to attenuate magnetic fields that impinge in a direction perpendicular to the shields. The shields therefore serve not only to contain magnetic fields associated with the windings within the region and reduce the magnitude of those fields outside of the region (e.g., external to the isolator 10), but also to similarly reduce the susceptibility of the windings (and thus the isolator circuitry) to the effects of fields generated externally to the isolator.

Figure 3:
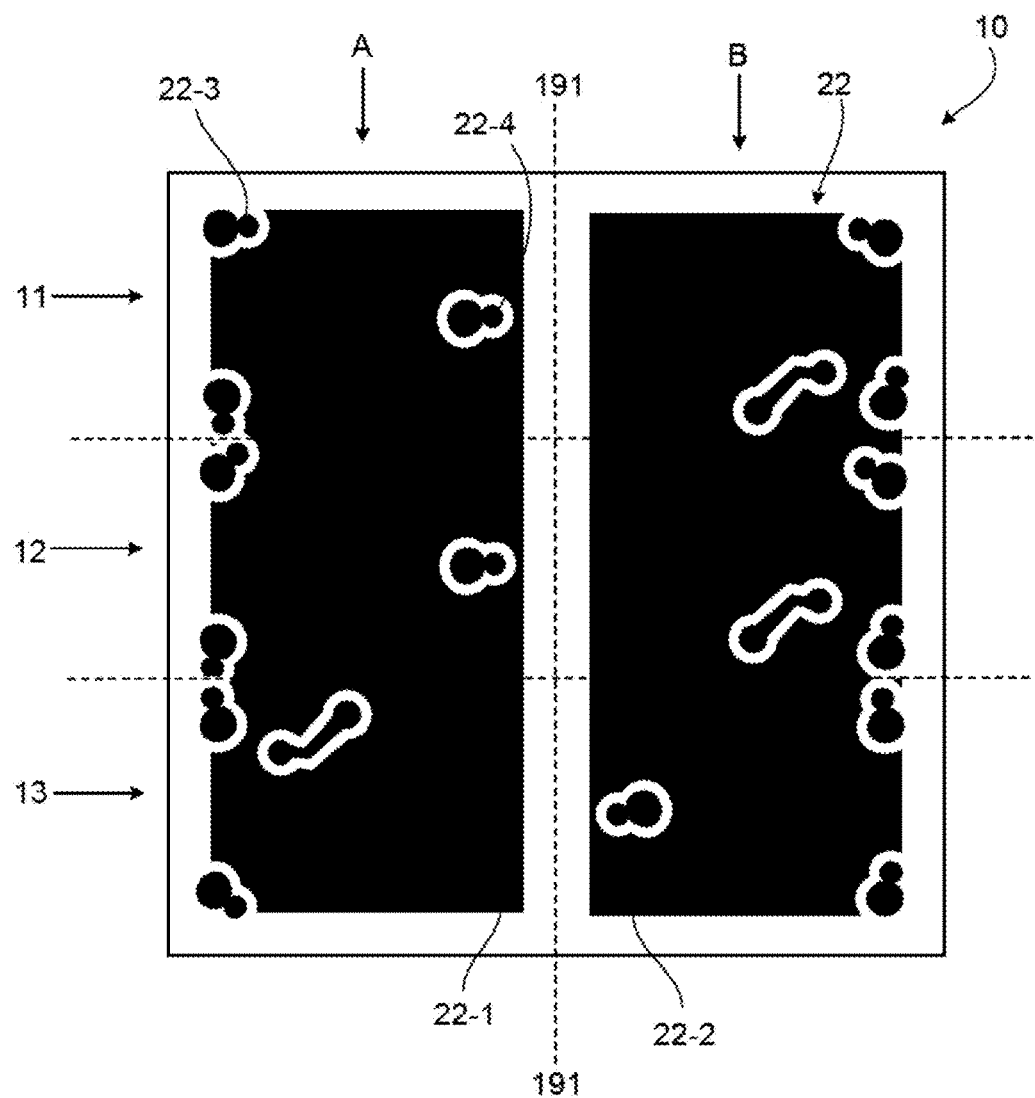
FIG. 3 is a plan view showing an upper inner conductive shield layer of a multichannel isolator.

Referring to FIGS. 3, 6, and 8, the upper and lower shield layers 22 and 25 may be divided into A-side and B-side sections along the isolation boundary 191. The top shield includes upper A-side segment 22-1 and upper B-side segment 22-2 and the bottom shield includes lower A-side segment 25-1 and lower B-side segment 25-2. The A-side and B-side segments of each shield, which are electrically insulated from each other, are separated by a predetermined conductor-free distance along the isolation boundary 191, separating the input circuitry from the output circuitry and generally bisecting the transformer windings. The upper and lower A-side segments (22-1, 25-1) and B-side segments (22-2, 25-2) may be connected to a common or reference terminal for the A-side circuitry, e.g. 44 (FIG. 7) and B-side circuitry, e.g. 48 (FIG. 7), respectively. The division and electrical insulation of the shield sections between input side and output side sections may improve the breakdown isolation rating from input to output of the isolator 10.

Although the A-side (22-1, 25-1) and B-side (22-2, 25-2) shields are shown as common to all three channels, it should be understood that the shields may be further divided such that each channel has its own shield which is isolated from the shields of the other channels.

Connection Terminals

The isolator 10 as shown is configured for surface mount soldering to an external PCB. In the plan view of FIG. 7, a set of pads 41 through 48 are shown formed in the bottom most conductive layer 26 of the substrate 20 which is exposed on the bottom surface of the isolator 10 and ideally suited to form surface mount solder connections between the isolator and a motherboard. The pads 41-48 may be formed as shown in FIGS. 7 and 8 along opposite sides of the isolation boundary 191 near the edges of the substrate 20. The configuration shown in FIG. 7 includes four pads 41-44 on the A-side and four pads 45-48 on the B-side of the isolator 10, sufficient for one input or output signal terminal per isolation channel and one common terminal for each side of the isolation boundary in the three channel example. Referring to FIG. 9, the input terminal 112 of each isolation channel may be used as a common and the output terminal 162 of each isolation channel may be used as a common on its respective side of the isolation boundary. Continuing with the three channel isolator example of FIGS. 1-10, the following pad assignments may be used: pad 44 for the A-side common terminal (connected to input terminals 112 of channels 11 and 12 and output terminal 162 of channel 13); pad 41 for channel 11 input terminal 111, pad 42 for channel 12 input terminal 111, and pad 43 for channel 13 output terminal 161; pad 48 for the B-side common terminal (connected to output terminals 162 of channels 11 and 12 and input terminal 112 of channel 13); pad 45 for channel 11 output terminal 161, pad 46 for channel 12 output terminal 161, and pad 47 for channel 13 input terminal 111.

Alternate terminal arrangements may also be provided, e.g., each isolator channel may be provided with a dedicated pair of input and/or output terminals in which case it may also be desirable to divide the A-side and B-side shields into separate shields for each channel. The termination pads may further include plating or conductive terminals such as pins for through hole or connector mounting or leads such as those described in Vinciarelli et al., Surface Mounting A Power Converter, U.S. Pat. No. 6,940,013, issued on Sep. 6, 2005 (the "J-Lead Patent") (assigned to VLT, Inc. of Sunnyvale, Calif., the entire disclosure of which is incorporated herein by reference) for surface mounting.

Electronic Components

As shown in FIG. 2, the top conductive layer 21 may be used to form conductive traces for electrical interconnections and conductive pads to which the electrical components of the interface circuitry may be electrically connected, preferably by surface mount soldering. The circuits of all three isolator channels 11, 12, 13 in the three channel isolator 10 (FIGS. 2-8) are the same and are described by the schematic of FIG. 9. Accordingly, the electrical components of channel 11, which will serve as the exemplary channel for this discussion, are labeled in FIGS. 2 and 8 using the same reference designations as are used in the schematic of FIG. 10. Since all three isolator channels are the same and use the same PCB layout, the following description will be limited to channel 11, with the understanding that the description may also be applied to the other two channels 12 and 13. Outlines of the electrical components are shown in FIG. 2 connected to the conductive pads to which they are connected.

As is well known in the PCB art, connections between the layers may be made with conductive vias that pass vertically through some or all of the layers with or without making electrical connections to a layer through which they are passed. For example, pads 22-3 and 22-4 as shown in FIG. 3 are electrically isolated from the A-side upper shield 22-1 are available for making connections to other conductive layers without connecting to the shield 22-1 through which they pass, which in this case are aligned with pads 23-5 (FIG. 4) at the ends of primary winding 23-1, allowing the primary connections to pass through layer 22 without connecting to either shield. A similar feature, pad 23-6 is shown in FIG. 4 for facilitating a connection through layer 23 without making any connection to the windings formed in that layer. In this manner, the circuits of each channel are connected using conductive traces and conductive vias to complete the circuit shown in the schematic of FIG. 10.

As described above, the three channels share a common terminal on each side of the isolation barrier and similarly share A-side and B-side shields for their respective transformer windings. Thus, the A-side shields 22-1 (FIG. 3) and 25-1 (FIG. 6) are electrically connected to each other and the A-side common terminal 44 (FIG. 7), and the B-side shields 22-2 (FIG. 3) and 25-2 (FIG. 6) are electrically connected to each other and to the B-side common terminal 48 (FIG. 7).

System in a Package Encapsulation

A side view of the isolator 10 in the region of channel 11 is shown in FIG. 8 with the components of channel 11 shown and the components of channels 12 and 13 hidden for clarity. The side view of FIG. 8 includes a cross-section of the substrate 20 showing the six conductive layers 21-26 of the substrate 20 as described above. Layer 21 is shown on the top surface of the substrate 20 below the surface mounted electrical components. Layer 26 is shown on the bottom surface of the substrate 20 as terminations 41 and 45 in FIG. 8. Layers 22 and 25 are shown divided into the respective shields and layers 23 and 24 are shown set in from the edges of the substrate 20 in FIG. 8. The separation of the A-side and B-side shields (A-side: 22-1, 25-1; B-side: 22-2, 25-2), electrical components (A-side: 115, 117, 118, 119, 120; B-side: 165, 166, 167, 168, 170), and terminals A-side: 41; B-side: 45) along isolation boundary 191, and windings (A-side: 23-1; B-side: 24-1) along isolation boundary 192 are illustrated in FIG. 8. An outline of the cured encapsulation material 50 of the preferred system in a package is also shown in FIG. 8 encapsulating the electrical components and the top of substrate 20. The encapsulation may provide better breakdown ratings for the isolator in small packages. The electrical components may preferably occupy the region above the transformer windings, e.g., windings 23-1 and 24-1 of isolator channel 11, and the shields, 22-1, 22-2, 25-1 and 25-2, are situated below the electrical components of isolator channel 11 as shown in FIG. 8.

Circuit Operation

Referring to FIG. 10, the input side interface circuitry 110 of the first isolator channel (11 in FIGS. 2-6; 100 in FIG. 10) may comprise resistors 116 and 117; capacitors 115 and 120; Schmitt trigger inverter 118 (which may be, e.g., a 74AUP1G14 Schmitt trigger inverter manufactured by NXP Semiconductor, Eindhoven, The Netherlands, and described in a datasheet entitled 74AUP1G14 Low-power Schmitt trigger inverter product data sheet, Rev. 5-28, November 2011); and diode 119 (which may be, e.g., a 1PS10SB82 Schottky barrier diode manufactured by NXP Semiconductor, Eindhoven, The Netherlands, and described in a datasheet entitled 1PS10SB82 Schottky barrier diode product data sheet, Aug. 20, 2003). The input side interface circuitry receives an input signal via terminals 111 and 112 and drives the primary winding (193 in FIG. 10; 23-1 in FIG. 4) via output terminals 113 and 114.

The output side circuitry 160 has input terminals 163 and 164 connected to the secondary winding (24-1 in FIG. 5; 194 in FIG. 10) and includes diode 166 (which may be, e.g., a 1PS10SB82 Schottky barrier diode, referenced above); capacitors 165 and 168; resistors 167, 169, 173; and dual transistor 170, comprising two NPN transistors 171 and 172 (which may be, e.g., a PMBT3904VS dual switching transistor manufactured by NXP Semiconductor, Eindhoven, The Netherlands, and described in a datasheet entitled PMBT3904VS, 40V, 200 mA NPN/NPN switching transistor product data sheet, Rev. 01-8, July 2009). The output side circuitry delivers an output signal via the output terminals 161 and 162.

The input-side interface circuit 110 may receive an input signal 101, which as shown in FIG. 9 may be a voltage signal. For simplicity, an isolator adapted for digital signals will be described, in which case the input signal Vin(t) 101 will be considered a binary voltage in which a logic one may be represented by a voltage greater than a predetermined minimum high-input voltage, e.g. 2.2 V, and a zero may be represented by a voltage less than a predetermined maximum low-input voltage, e.g. 1.2 V.

Figure 11:
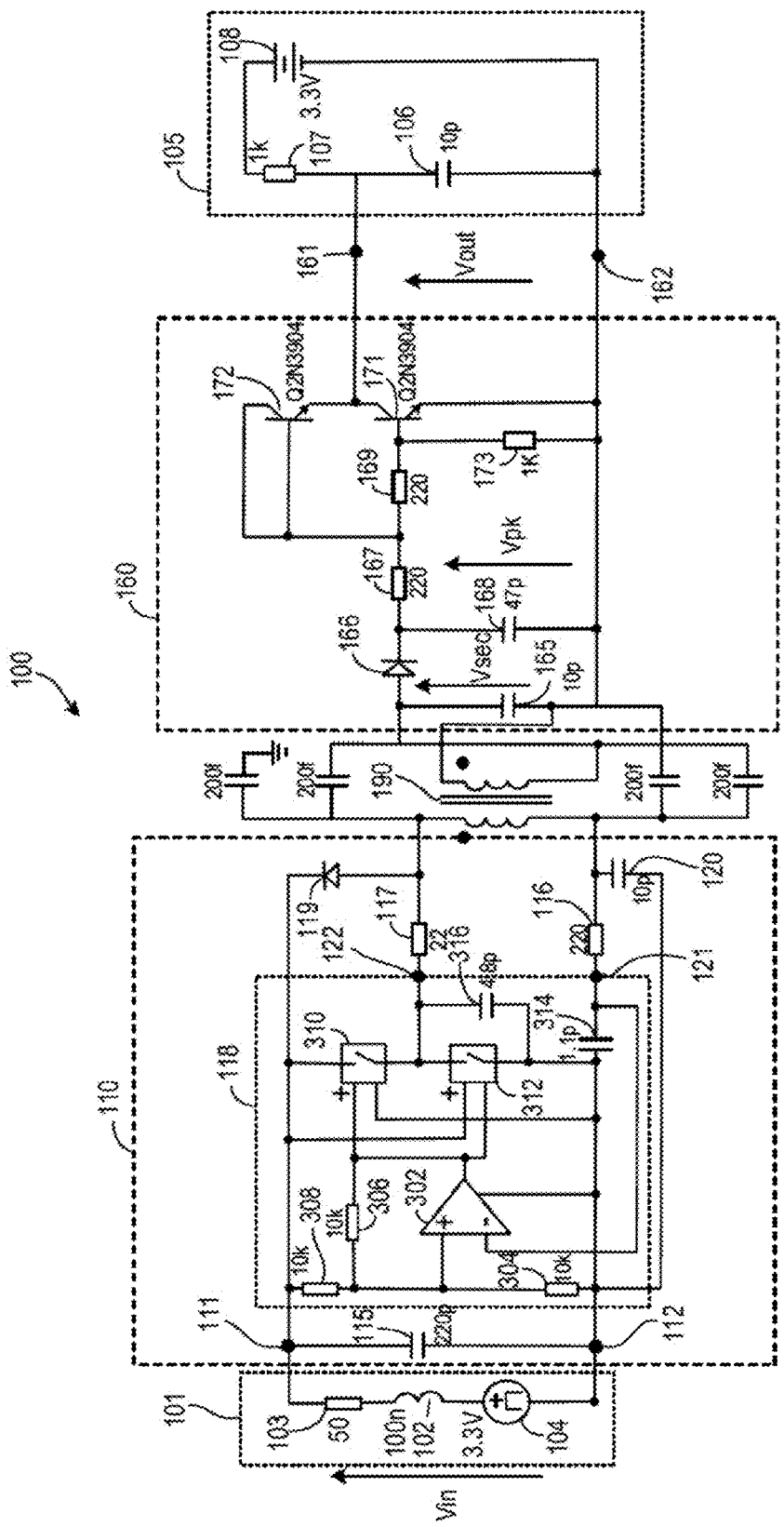
FIG. 11 is a schematic of a behavioral model of the circuit of FIG. 10.

Referring to FIG. 11, a behavioral model of the single channel isolator circuit of FIG. 10 is provided with component values and using component reference designations corresponding to the counterpart components shown in FIG. 10. The input signal has been modeled as a 3.3 Volt pulsed voltage source 104 having a 100 nH series inductance 182 and 50 Ohm series resistance 103. The load circuit 105 for the isolator 100 has been modeled with a 3.3 Volt load bias 108, a 1K pull-up resistor 107 and a 10 pF load capacitance 106.

A behavioral model of the Schmitt trigger inverter 118 in FIG. 10 is shown as the circuitry contained within the dashed area 118 in FIG. 11. The inverter behavioral model 118 accepts an input at node 121 and generates an output at node 122, corresponding to the same nodes in FIG. 10. The model 118 includes high speed comparator 302 (e.g., having a characteristic response time of 5 nS); resistors 304, 306, and 308; parasitic input capacitance 314; parasitic output capacitance 316; and voltage-controlled switches 310 and 312. The voltage controlled switches 310, 312 are configured so that switch 310 is ON and switch 312 is OFF when the output of the comparator 302 is high, and switch 310 is OFF and switch 312 is ON when the output of the comparator 302 is low. Resistors 308, 306 and 304 set the hysteresis and input thresholds for the comparator 302: with a voltage Vin across input terminals 111, 112, and with the resistor values shown in FIG. 11, the upper threshold for the comparator is set to $\frac{2}{3}*Vin$ and the lower threshold is set to $\frac{1}{3}*Vin$. Thus, if the comparator input 121 is below $\frac{1}{3}*Vin$, the output 122 will remain high until the comparator input 121 goes above $\frac{2}{3}*Vin$ at which time the output 122 will go low. Similarly, if the comparator input 121 is above $\frac{2}{3}*Vin$, the output 122 will remain low until the comparator input 121 goes below ⅓*Vin at which time output 122 will go high.

Power for the input side circuitry is provided exclusively by the data input signal Vin at terminals 111, 112. When the data input signal goes high (e.g., Vin=3.3V), the input side interface circuit 110 will power-up and oscillate at a resonant frequency that is primarily determined by the inductances of transformer 190 and the values of primary side capacitor 120 and secondary side capacitor 165. The relative degree to which capacitors 120 and 165 affect the resonant frequency is a function of the coupling coefficient, k, of transformer 190: for relatively low coupling coefficients (e.g., k=0.5) the equivalent resonant capacitance may be dominated by primary side capacitor 120; for relatively higher values of k (e.g., close to 1) the equivalent resonant capacitance may approach the sum of the values of capacitor 120 and the reflected value of secondary side capacitor 165.

The oscillating voltage, Vsec, across capacitor 165 is rectified by diode 166 and smoothed by capacitor 168. The voltage, Vpeak, across capacitor 168 turns ON transistor 171. Transistor 172 is arranged to act as a Baker clamp to prevent transistor 171 from saturating. This ensures rapid turning OFF of transistor 171 when the data input signal goes low and oscillation ceases. The detector circuit 160, which is powered exclusively by energy transferred from the input circuit 110 via the transformer 190, provides an open-collector output for sinking an output current (analogous to that of an opto-coupler). The open-collector output when activated sinks a current from the output voltage Vout. The load pull-up voltage (source 108 in FIG. 11) should not be confused with a source of bias or operating power for the detector circuit 160 which operates exclusively from power provided by the input signal (pulsed source 104) via transformer 190.

Figure 12:
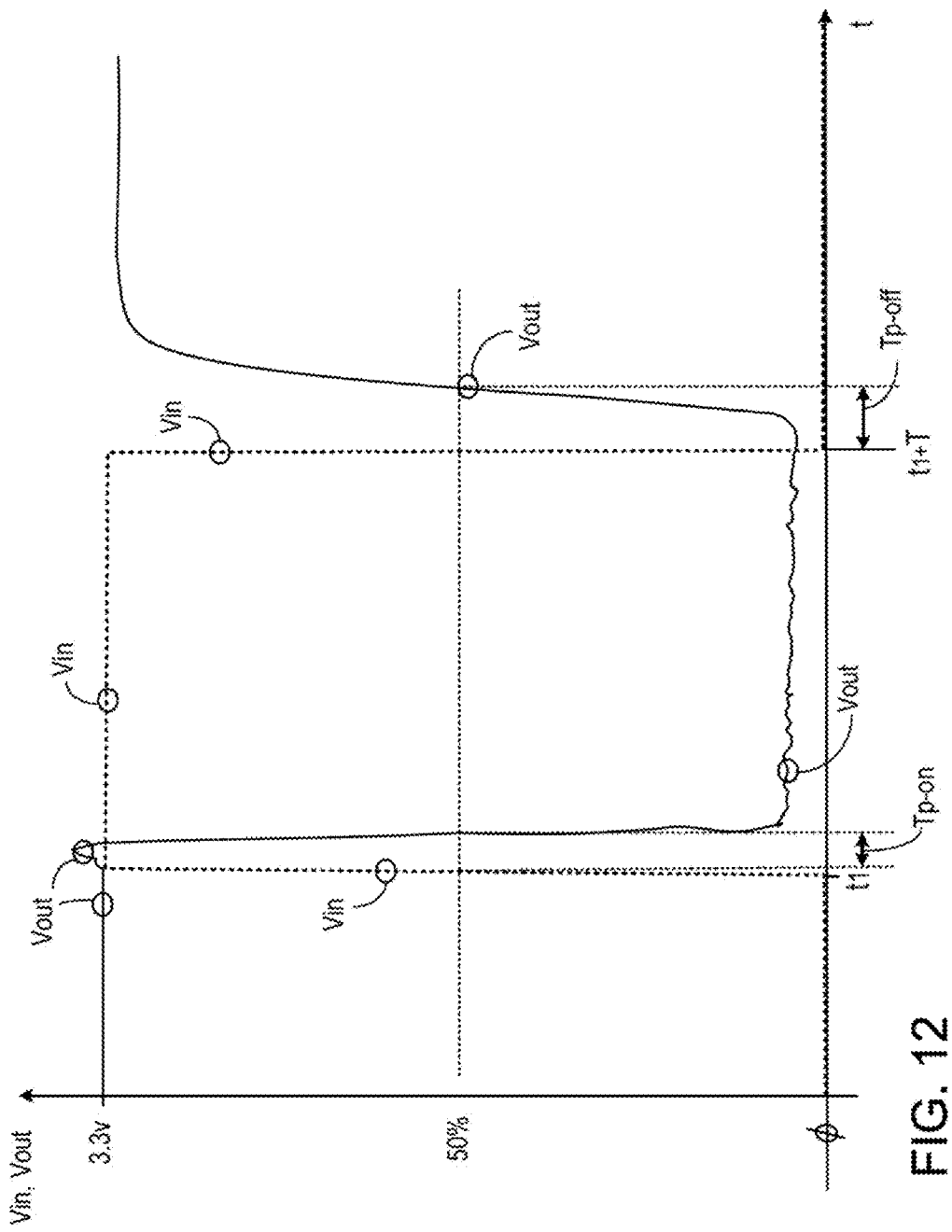
FIGS. 12 and 13 show waveforms for the circuit of FIG. 11.
Figure 13:
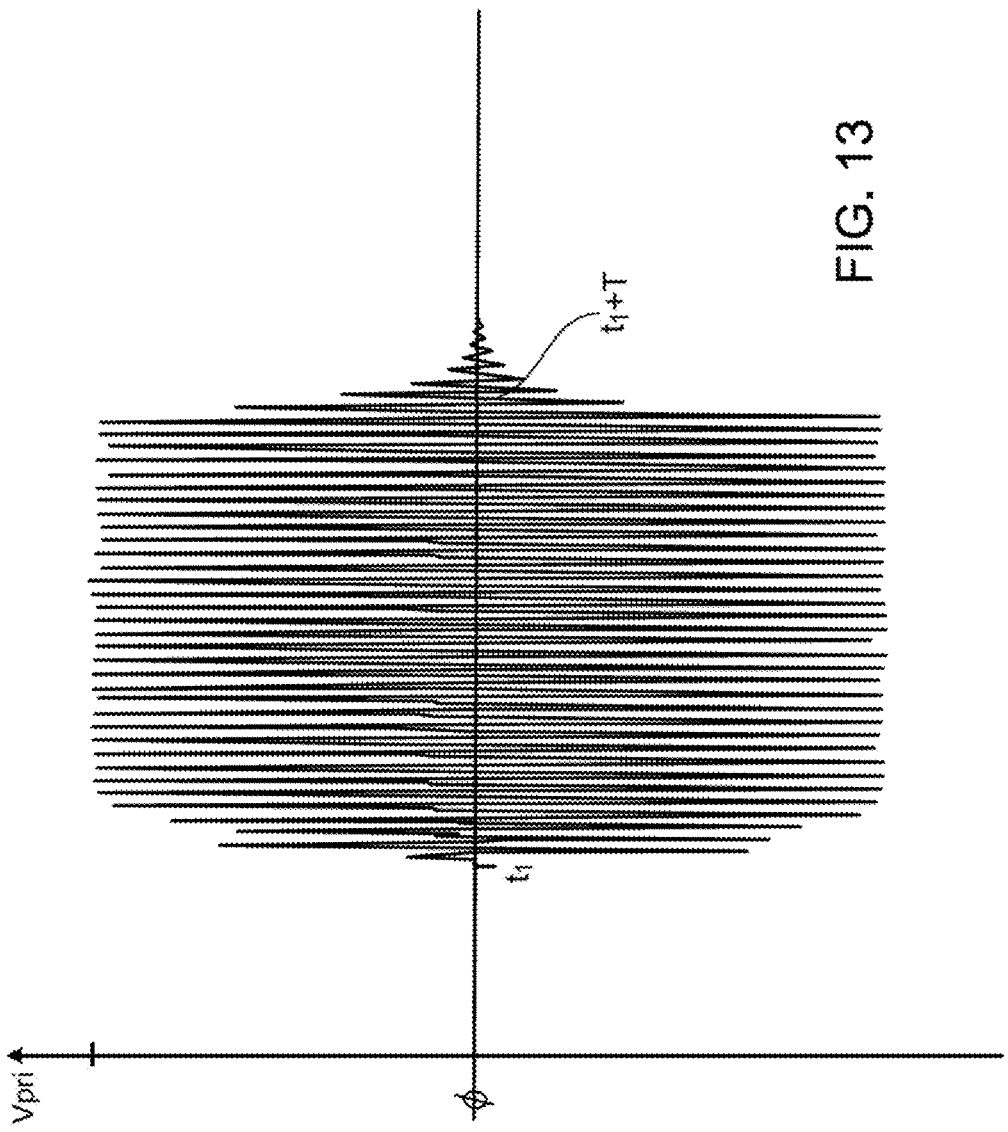

FIGS. 12 and 13 show simulated operating waveforms for the behavioral circuit of FIG. 11 with the component values shown; with a transformer 190 characterized by a 1:1 turns ratio, a primary inductance of 220 nH, and a coupling coefficient k=0.54; with the data input signal, Vin, comprising a series of 500 nanosecond pulses and using the load circuit 105 as shown in FIG. 11. The resonant frequency of oscillation of the isolator 100 is approximately 72 MHz. FIG. 12 shows a single input pulse beginning at time t1 and ending at time t1+T, where T is the pulse width of 500 nanoseconds and the isolator output voltage, Vout. As shown in FIG. 12, the output signal is a faithful reproduction of the input signal with a propagation delay from input to output for turn ON, Tp-on, approximately 45 nS and for turn OFF, Tp-off, approximately 77 nS (measured at the 50% point). FIG. 13 shows the approximately 72 MHz oscillating waveform across the primary winding 193 during the 500 nS input pulse.

In resonant embodiments that comprise multiple isolator circuits, such as the embodiment of FIGS. 2 through 9, it may be desirable to operate each isolator circuit at a different frequency of oscillation as this may reduce crosstalk between circuits, e.g., channels 11, 12, and 13 may be operated at approximately 50, 75, and 100 MHz.

Digital Primary Implementation

Figure 14:
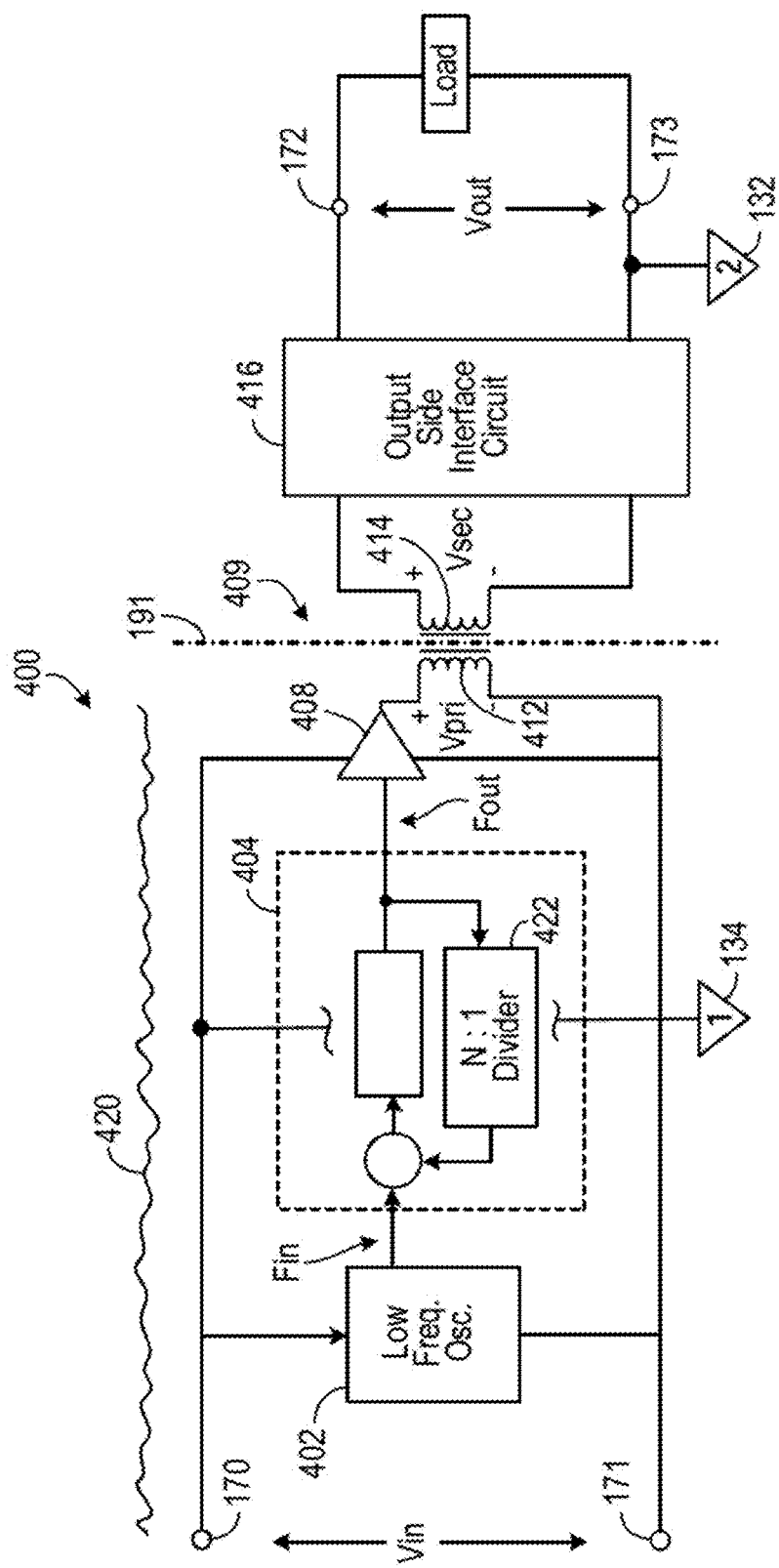
FIG. 14 shows a block diagram of another embodiment of single isolator channel.

The example shown in FIGS. 10 and 11 use an analog oscillator circuit, which includes the transformer in the oscillator loop, to drive the primary winding. Another example of a single isolator channel 400 is shown in FIG. 14 using digital interface circuitry 420 to drive the primary winding of the transformer. The digital implementation as shown may include a low frequency oscillator 402 that delivers a relatively low frequency output signal, Fin, e.g. 2.5 MHz, to a frequency multiplier 404 that delivers a high frequency output, Fout=N*Fin, e.g. N=100, Fout=250 MHz. A buffer 408 may be used to drive the primary winding 412 of transformer 410 with the high frequency signal, Fout. As shown in FIG. 14, the frequency multiplier may include a digital phase-locked loop which may for example use a digital N:1 divider 422 in the feedback path. As shown, the oscillator 402 operates without closing a loop on the transformer resonant circuit; however, the transformer may be tuned to the approximate high frequency signal, Fout.

In operation, the digital implementation of the primary-side interface circuitry performs the same basic function as in the previous example: for input signals, Vin, greater than the predetermined threshold, power derived from the input signal is supplied to the input interface circuitry 420 which in turn drives the primary winding of the transformer with the high frequency signal, Fout. The output side interface circuitry 416 (which may, e.g., be substantially the same as output side circuitry 160 shown in FIG. 10) receives the high frequency signal from secondary winding 414 and drives the output, Vout, low whenever the presence of the high frequency signal is detected.

Analog Isolator

Figure 15:
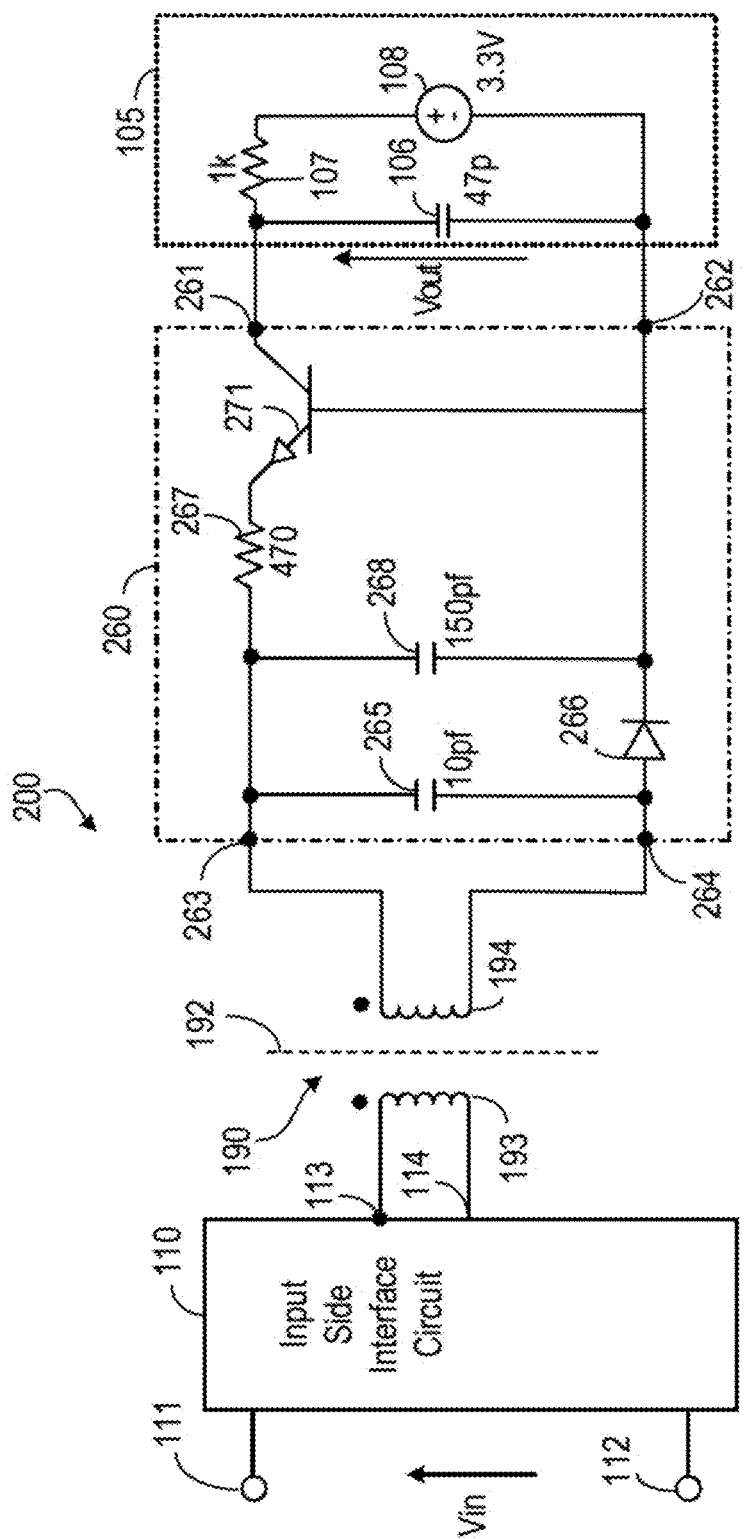
FIG. 15 shows a block diagram of a single isolator channel with proportional output circuitry.

The previous examples of FIGS. 10, 11, and 14 were discussed in the context of transmitting a binary signal across the isolation boundary; however, the isolator may be modified to provide transmission of an analog or proportional signal across the isolation boundary. Referring to FIG. 15, a modified single channel isolator 200 is shown including a primary-side interface circuit 110 (which may be the same as the previously discussed primary-side interface circuits 110, FIG. 10; 420, FIG. 14), and a modified secondary-side interface circuit 260 capable of providing an output signal that is proportional to the input signal over a predetermined range. The secondary winding 194 is connected to the input 263, 264 of the secondary-side interface circuit 260. Capacitor 265, like capacitor 165 may be used to influence the resonance of the transformer circuit. Diode 266 and capacitor 268 provide peak detection of the secondary voltage. A common-base transistor amplifier 271 decouples the output 261, 262 from the peak detection circuit and sinks a current proportional to the magnitude of the secondary voltage over a predetermined voltage range. The output circuit model 105 includes a slightly larger (47 pF) capacitor 106 for the proportional application as compared to the 10 pF value in the example of FIG. 11.

The input-side interface circuit 110 shown in FIGS. 10 and 11 performs well as a proportional transmitter when used in conjunction with the modified output-side interface circuit 260 in FIG. 15. Above a minimum input voltage of approximately 1.6 V, required to start the oscillator and provide power to the output-side interface circuit 260, the input-side interface circuit 110 will drive the primary winding 193 in proportion to the input voltage thus amplitude modulating the secondary voltage. The output-side interface circuit 260 is adapted to sink an output current that is in proportion to the amplitude of the secondary voltage over a predetermined operating range.

Figure 16:
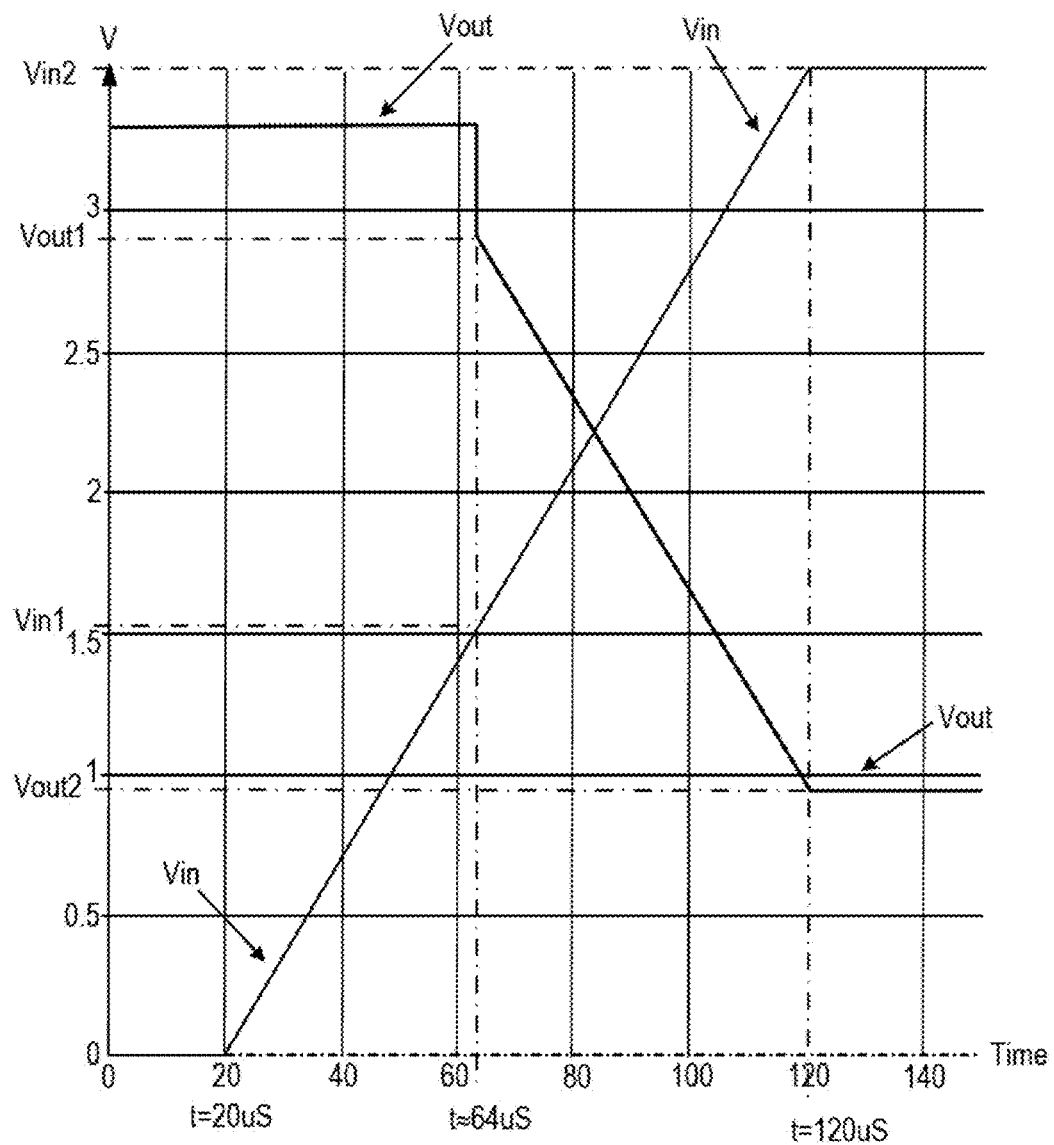
FIG. 16 shows waveforms for the circuit of FIG. 15.

Referring to FIG. 16, a simulation plot of the input and output voltages versus time for the isolator 200 (using the primary-side interface circuit 110 of FIGS. 10 and 11 and the output-side interface circuit 260 of FIG. 15) are shown. For the simulation plot of FIG. 16, the pulse function voltage source 104 shown in FIG. 11 has been modified to ramp linearly from 0 volts at time t=20 μS to approximately 3.5 V at t=120 μS. As shown in FIG. 16, as the input voltage approaches a minimum operating input voltage, Vin1 (Vin≈1.6 V, t≈64 μS), the output voltage drops from 3.3 V to Vout1 (Vout≈2.9 V). Thereafter, the output voltage decreases linearly from Vout1 (≈2.9 V) to the minimum, Vout2 (Vout≈0.9 V, t≈120 μS), in proportion to linear increases in the input voltage from the minimum Vin1 (Vin≈1.6 V, t≈64 μS) to a maximum Vin 2 (Vin≈3.5 V, t≈120 μS). As shown by the simulation plots, the isolator 200 can function as an analog isolation channel in the range from Vin1 to Vin2.

In some implementations, it may be advantageous to provide communication across an isolation barrier spanning a distance and characterized by the electrical circuitry for one side being located on one PCB and the electrical circuitry of the other side being located on another physically separate PCB. For example, input filter circuitry may be provided on an input board, supervisory circuitry may be provided on an output board, and a power converter may be located between the input and output boards. In such implementations, the isolator circuitry may be divided between the two circuit boards, the input-side isolator interface circuitry be located, e.g., on the input PCB and the output-side isolator interface circuitry may be located on the output board, and a bridge board containing the primary and secondary side windings may be used to bridge the gap between the input and output boards, e.g., as shown in and described below in connection with FIGS. 17-20.

The bridge board isolator 500 shown in FIGS. 17-20, includes an input-side circuit board 510, an output-side circuit board 530, and a bridge board 520 coupled to the boards 510, 530. The input-side board 510 may include a multilayer substrate or PCB supporting input-side circuitry such as input filters, fuses, etc., (represented as components 519) associated with the input of a power converter (not shown) and input-side isolator interface circuitry (e.g. on the A side of the isolation boundary) (represented by isolator components 513). The isolator interface circuitry may comprise any of the previously described circuit implementations including those shown in FIGS. 9-11, 14-15. Using the isolator circuit of FIG. 10 as an example, the input-side interface circuit 110 of FIG. 10 may be incorporated onto the input side circuit board 510.

The output-side circuit board 530 may include a multilayer substrate or PCB supporting output-side circuitry such as supervisory power management circuitry (represented by components 539) associated with the output of a power converter (not shown) and output-side isolator interface circuitry (e.g., on the B side of the isolation boundary) (represented by components 533). Continuing the above example using the isolator circuit of FIG. 10, the output-side interface circuit 160 may be incorporated into the output side circuit board 530.

The bridge board 520, which contains the transformer windings and shields, may be constructed and arranged to span the distance between the input circuit board and the output circuit board providing isolated connections between the two circuit boards. As shown in FIGS. 17-20, electrical connectors may be provided on the circuit boards to make electrical connection to the bridge board, e.g. connectors 511, 531. Features such as slots 512, 532 may be added to the input and output circuit boards 510, 530 to facilitate proper alignment and provide mechanical stability for the bridge board. The bridge board 520 is coupled to the input-side board 510 through a connector 511, and coupled to the output-side board 530 through a connector 531. The connector 511 as shown may be mounted near a slot 512 formed at an edge of the input-side board 510. The connector 511 has contacts 514, 515, 516, 517 that extend into the slot 512. The contacts 514, 515, 516, 517 are, e.g., the A side ground contact, channel 1 A side contact, channel 2 A side contact, channel 3 A side contact, respectively. The connector 531 as shown may be mounted near a slot 532 formed at an edge of the output-side board 510. The connector 531 has contacts 534, 535, 536, 537 that extend into the slot 532. The contacts 534, 535, 536, 537 are, e.g., the B side ground contact, channel 1 B side contact, channel 2 B side contact, channel 3 B side contact, respectively. The bridge board 520 has a first end 520A that can be inserted into the slot 512, and a second end 520B that can be inserted into the slot 532. Additional circuit components 519 can be mounted on the input-side board 510, and additional circuit components 539 can be mounted on the output-side board 530.

Separating the transformer windings and shields on the bridge board 520 from the isolator interface circuitry and other input and output circuitry on the input-side and output-side circuit boards 510, 530 allows for use of a five conductive layer for the bridge board (eliminating one of the six conductive layers, e.g., the top layer 21, compared to the integrated isolator shown in FIGS. 1-8; and reduces the conductive layer count of the input-side circuit board 510 and/or output-side circuit board 530 compared to what would have been required had the transformer and shields been incorporated into the same PCB that would support some or all of the electronic components, minimizing the area of the high layer count PCB (the bridge board) and saving in PCB costs, and further eliminating an additional wiring harness that might be required to connect the input board to the output board.

Figure 17:
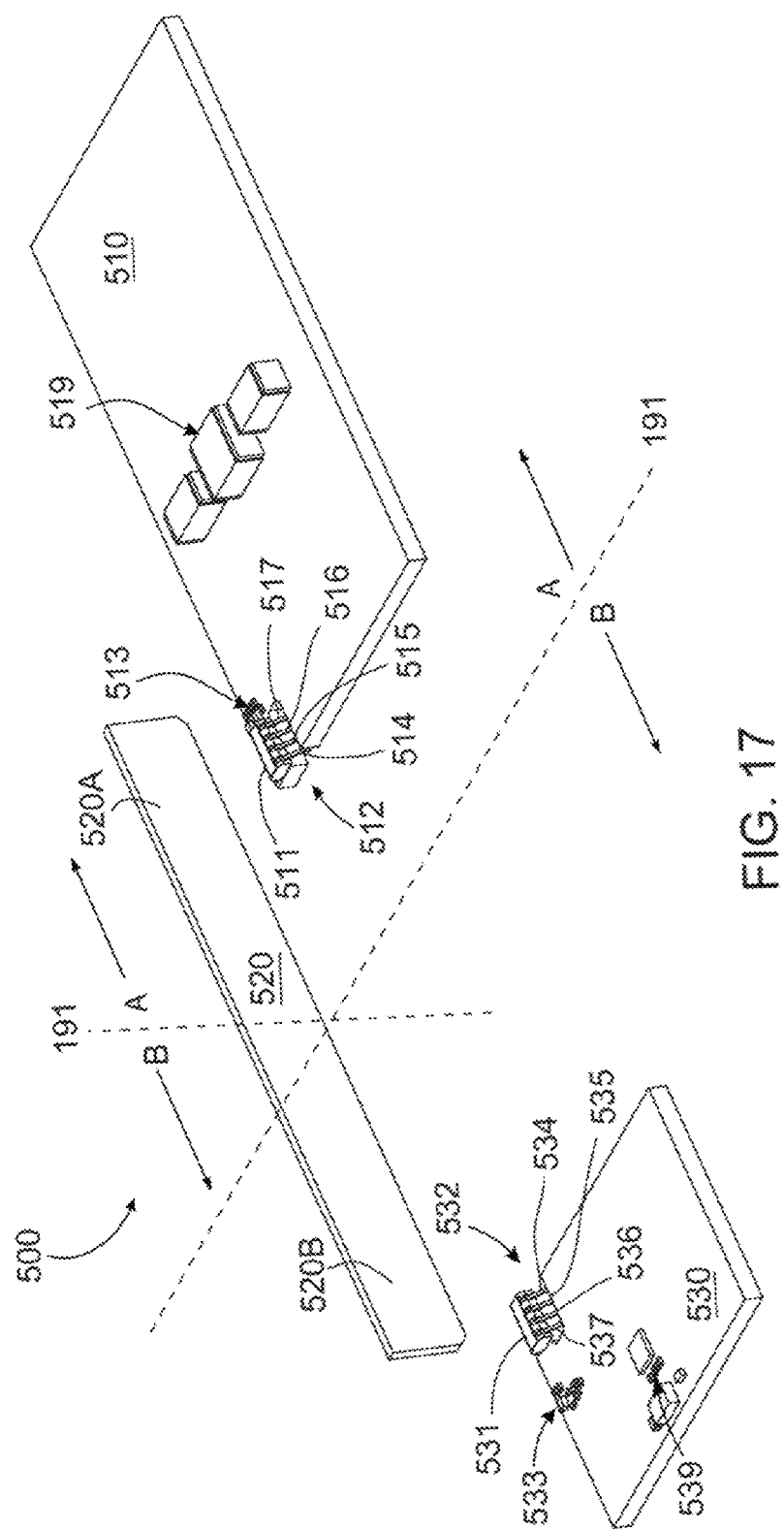
FIGS. 17 and 18 show diagrams of a bridge board configured to be connected to two circuit boards.

The diagram in FIG. 17 shows an isolation boundary 191 that represents separation of the input-side (A-side) and output-side (B-side) components. In some implementations, the boundary 191 also indicates that, on the bridge board 520, conducting lines or traces coupled to the input-side circuit board 510 are placed on the A-side of the bridge board 520, and conducting lines or traces coupled to the output-side board 530 are placed on the B-side of the bridge board 520.

Figure 18:
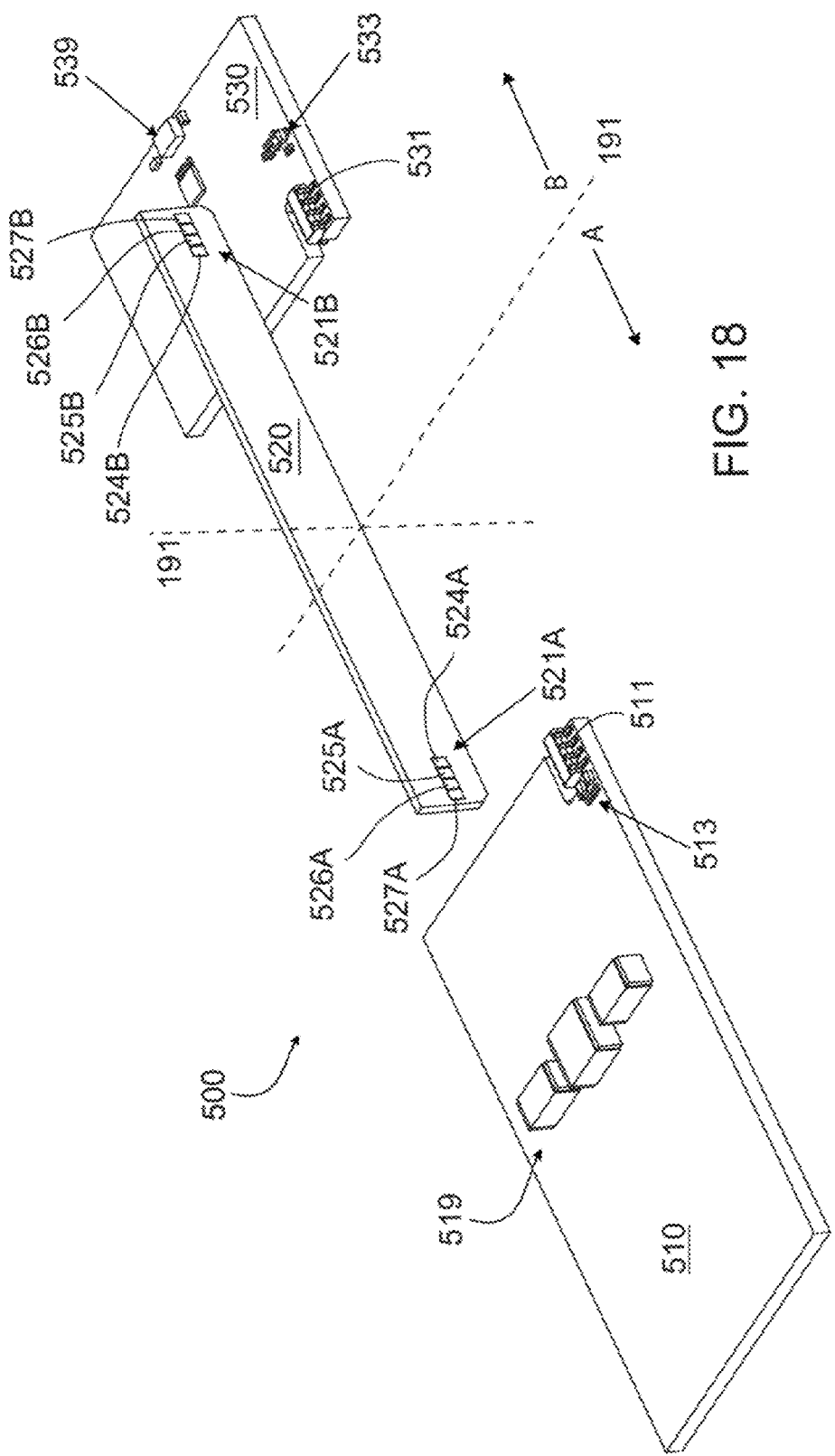

As shown in FIG. 18, the bridge board 520 may include contacts 521A, 521B that mate with respective contacts of connectors 511, 531 on the input-side and output-side circuit boards 510, 530. In the example shown, A-side contacts 521A include contacts 524A, 525A, 526A, and 527A on the bridge board respectively provide electrical connections to the A-side ground and shield, and the channel 1, channel 2, and channel 3 A-side transformer windings, and are designed to mate with the respective contacts 514, 515, 516, and 517, of the connector 511 on the input-side circuit board 510 when the portion 520A of the bridge board 520 is inserted into the slot 512. Similarly, B-side contacts 521B include contacts 524B, 525B, 526B, and 527B on the bridge board respectively provide electrical connections to the B-side ground, channel 1, channel 2, and channel 3 B-side transformer windings and are designed to mate with the respective contacts 534, 535, 536, and 537, of connector 531 on the output-side circuit board 530 when the portion 520B of the bridge board 520 is inserted into the slot 532.

Figure 19:
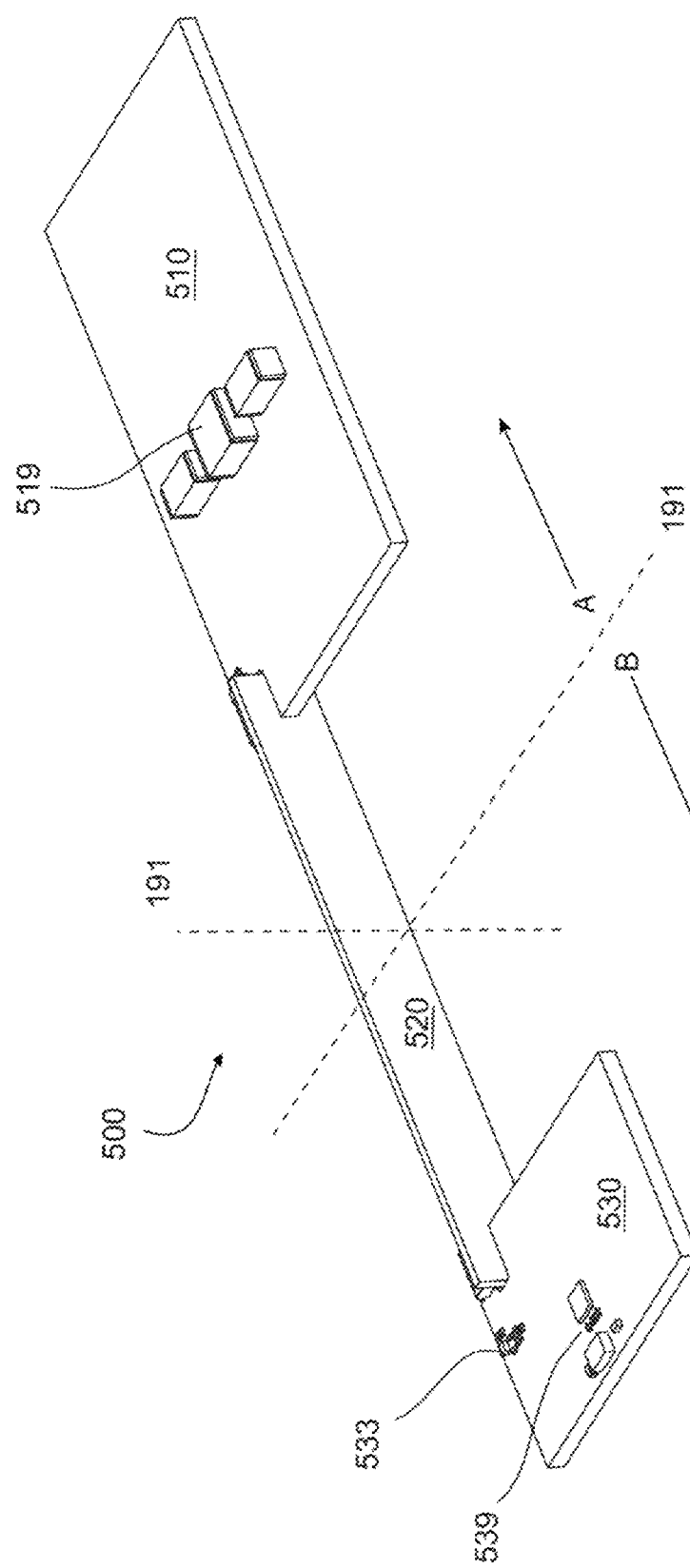
FIGS. 19 and 20 show diagrams of the bridge board connected to the two circuit boards.
Figure 20:
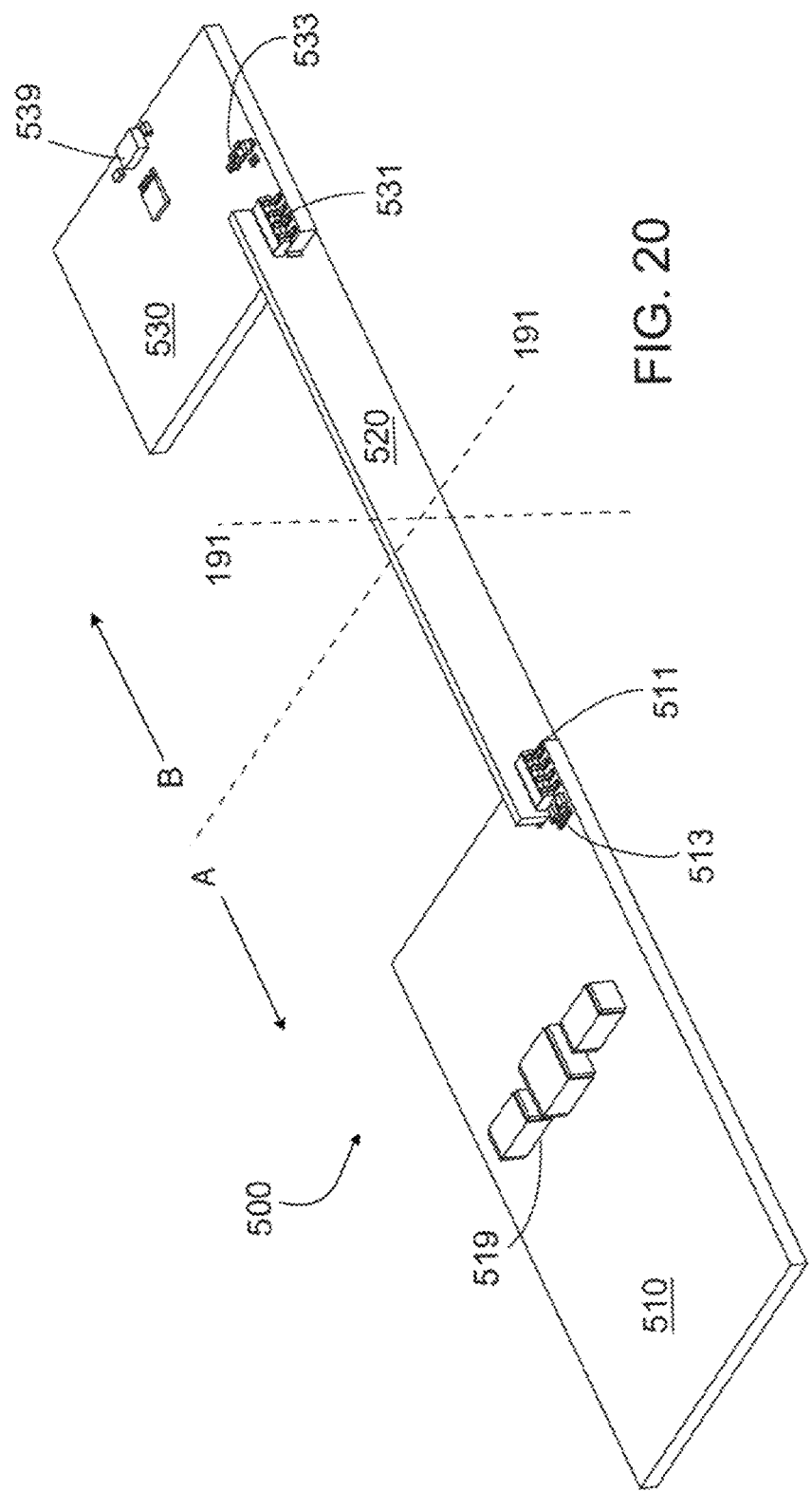

FIGS. 19 and 20 show perspective views of the bridge board 520 inserted into slots 512, 532 with A-side contacts 524A, 525A, 526A, and 527A on the bridge board 520 mated with the respective contacts 514, 515, 516, and 517, on the input-side circuit board 510, and B-side contacts 524B, 525B, 526B, and 527B on the bridge board 520 mated with the respective contacts 534, 535, 536, and 537, on the output-side circuit board 530.

Figure 21:
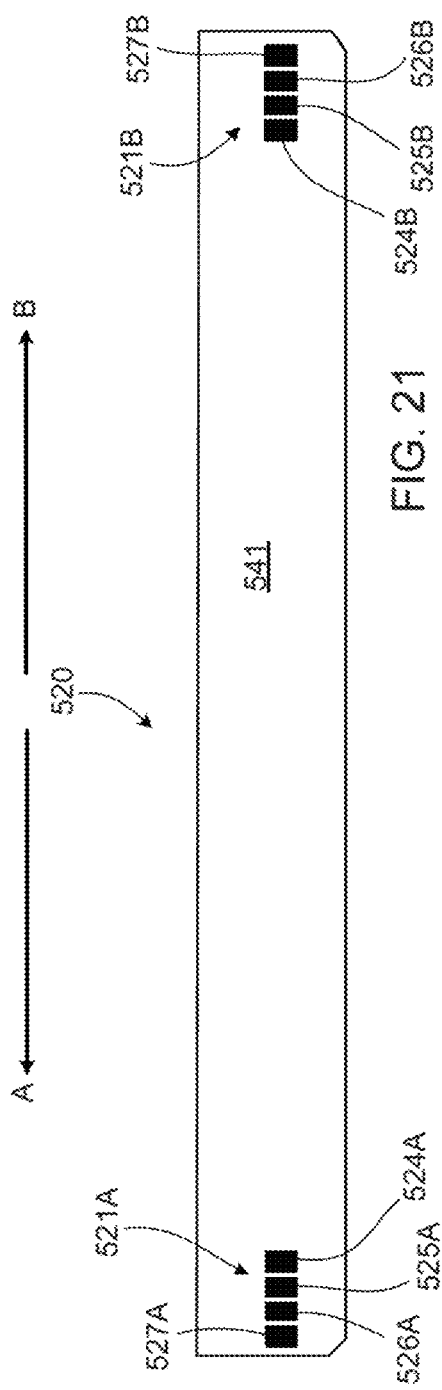

The patterned conductive layers of the bridge board 520 are shown in FIGS. 21 to 25 with FIG. 21 showing the outermost conductive layer in which conductive contacts 521A and 521B are formed. FIG. 26 shows the opposite outermost surface of the bridge board which is an insulation layer, and which, as shown, may be free of conductive features. Referring to FIG. 21, a first PCB layer 541 includes the contacts 524A, 525A, 526A, 527A, 524B, 525B, 526B, and 527B. The PCB layer 541 is positioned at the outside of the bridge board 520.

Figure 22:
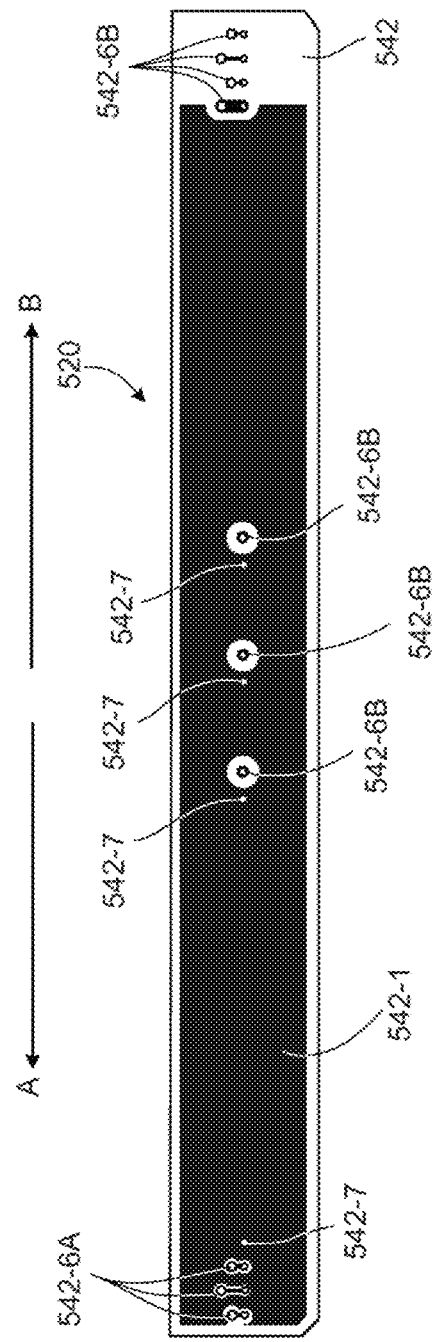
Figure 23:
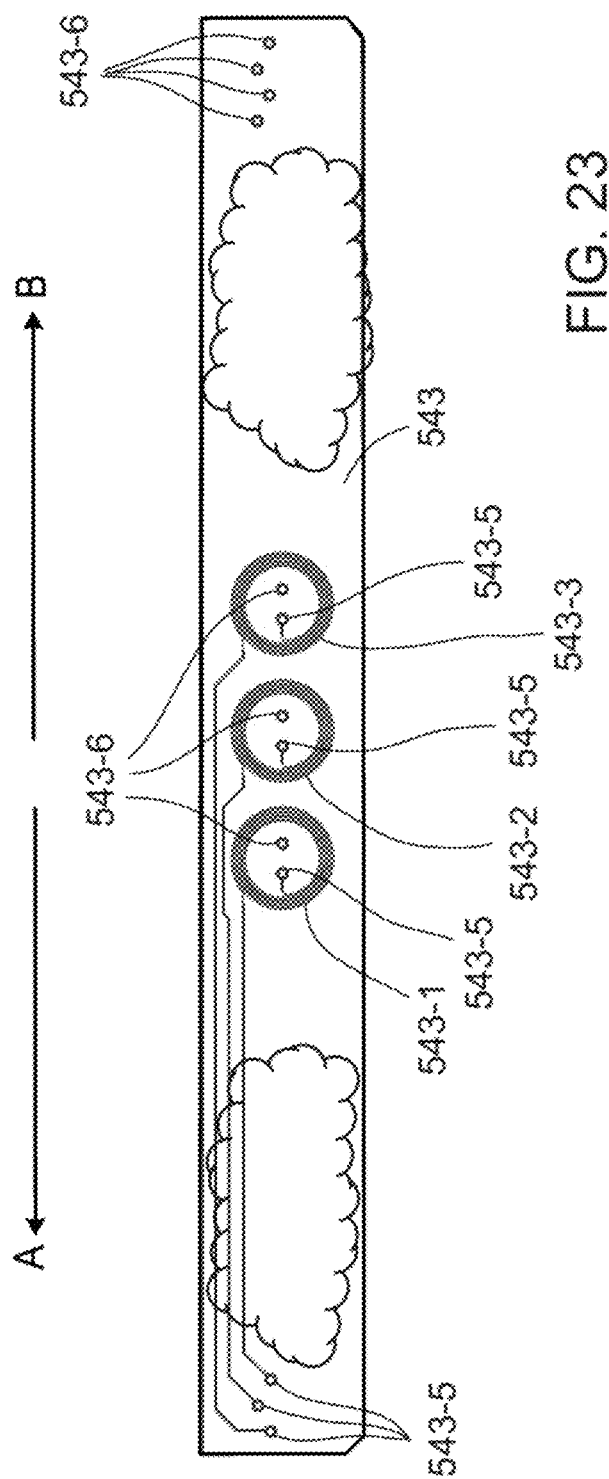

Referring to FIG. 22, a second PCB layer 542 includes an A-side conductive shield 542-1, isolated vias and traces 542-6A for making A side connections to other conductive layers, and isolated vias and traces 542-6B for making B side connections to other conductive layers. There is a greater clearance between the isolated vias or traces 542-6B and the A side conductive shield 542-1, as compared to the clearance between the isolated vias or traces 542-6A and the A side conductive shield 542-1. The PCB layer 542 also includes vias (connections) 542-7. As shown in FIG. 23, the A-side transformer windings, 543-1, 543-2, 543-3 corresponding to channels 1, 2, and 3, may be formed in third conductive PCB layer 543. Each end of the A-side windings 543-1, 543-2, 543-3 is electrically connected to a respective conductive via 543-5, with the inner end of each winding connecting to a respective via 543-5 located within its circumference to the A-side ground and shield 542-1 (vias 542-7; FIG. 22) and with the outer end of each winding connecting via a trace to a respective via 543-5 at the left end of the bridge board through a respective pad and via 542-6A on the second conductive layer (FIG. 22) to a respective contact 524A, 525A, 526A on the first conductive layer (FIG. 21). The PCB layer 543 further includes isolated pads and vias 543-6 which pass electrical connections to other conductive layers and around which minimum clearances may be provided for isolation.

Figure 24:
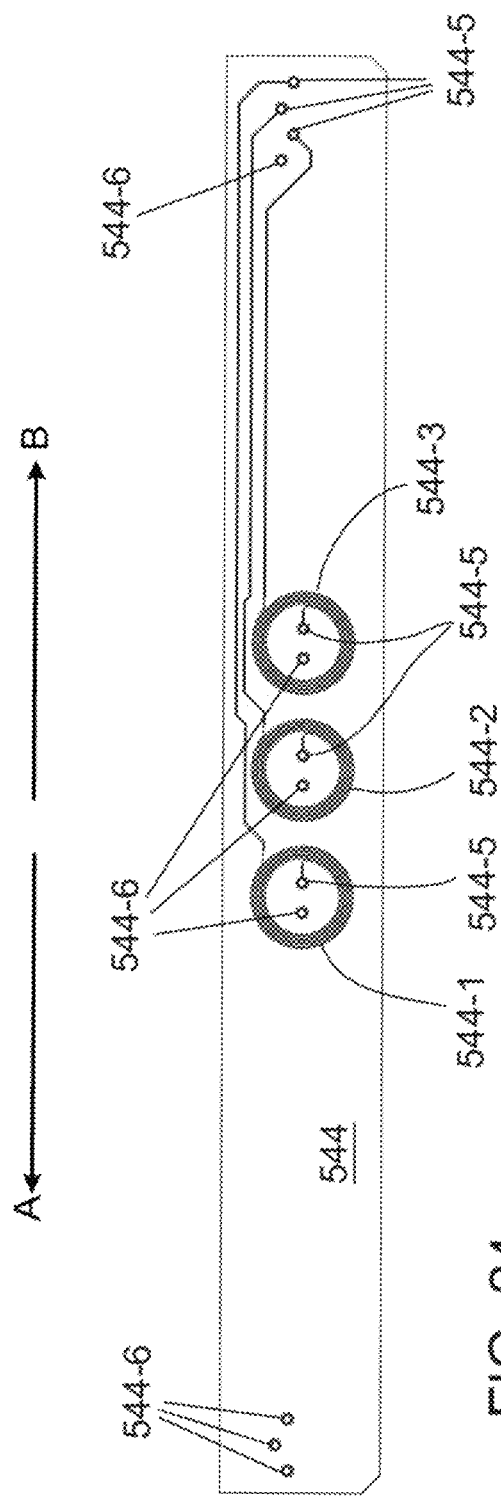
Figure 28:
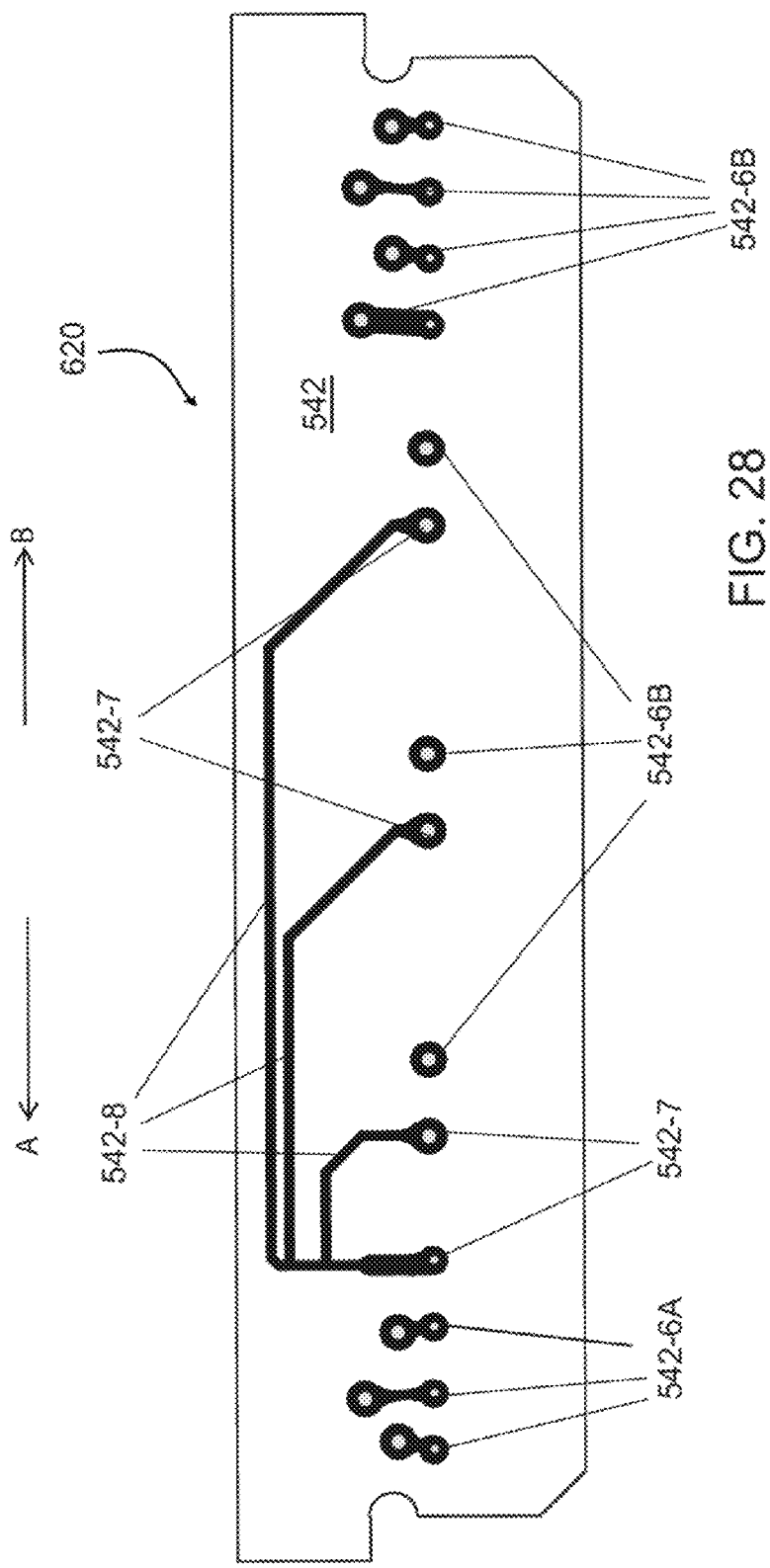

Similarly, the B-side transformer windings 544-1, 544-2, 544-3 respectively corresponding to channels 1, 2, and 3 and aligned with its respective A-side winding may be formed in a fourth conductive layer 544 as shown in FIG. 24. Each end of the B-side windings 544-1, 544-2, 544-3 is electrically connected via traces to a respective conductive via 544-5, with the inner end of each winding connecting to a respective via 544-5 located within the winding circumference and connecting to the B-side ground and shield 545-2 (vias 545-7; FIG. 25) and with the outer end of each winding connecting to a respective via 544-5 at the right end of the bridge board through respective isolated pads and vias 543-6 on the third conductive layer (FIG. 23) and 542-6B on the second conductive layer (FIG. 22) to a respective contact 524B, 525B, 526B on the first conductive layer (FIG. 21). The PCB layer 544 further includes isolated pads and vias 544-6 which pass electrical connections to other conductive layers around which minimum clearances may be provided for isolation.

The B-side shield 545-2 may be provided in a fifth PCB layer 545 as shown in FIG. 25. The B-side conductive shield 545-2 may include isolated pads and vias 545-6A for making connections to the A side, and isolated pads and vias 545-6B for making electrical connections to the B side. As shown, greater clearance may be provided between the isolated A-side pads and vias 545-6A and the B side conductive shield 545-2 for isolation and safety agency requirements, as compared to the clearance between the isolated pads or traces 545-6B and the B side conductive shield 545-2. In FIG. 25, vias 545-7 are shown for electrically connecting the inner ends of the B-side windings and the surface contact 524-B (FIG. 21) to the B-side shield and ground 545-2.

The A side windings 543-1, 543-2, 543-3 and the B side windings 544-1, 544-2, 544-3 are positioned between the A side conductive shield 542-1 and the B side conductive shield 545-2. The A side conductive shield 542-1 and the B side conductive shield 545-2 define a region in the bridge board 520 within which the transformer windings may be situated and may act as eddy current shields to attenuate magnetic fields that impinge in a direction perpendicular to the shields. The shields therefore serve not only to contain magnetic fields associated with the windings within the region and reduce the magnitude of those fields outside of the region (e.g., external to the bridge board 520), but also to similarly reduce the susceptibility of the windings (and thus the isolator circuitry) to the effects of fields generated externally to the bridge board 520, e.g., from a nearby switching power converter (not shown). In this example, the region between the A side conductive shield 542-1 and the B side conductive shield 545-2 is free of magnetically permeable material, e.g., having a relative permeability $\mu_r$ of less than 2 or 5.

The bridge board 520 may include a first area for A-side circuitry and a second area for B-side circuitry, in which the first and second areas can accommodate some or all of the isolator circuitry. FIG. 23 shows the positions of the first and second areas relative to the windings, with the understanding that the A-side circuitry and B-side circuitry are mounted on one (or both) of the bridge board surfaces. The A-side circuitry may include a first driver circuit including at least one electronic component mounted to a surface of the bridge board on the A-side of the isolation boundary. The first driver circuit may have an input connected to the A-side contacts for receiving an input signal from the external A-side circuit and an output connected to the A-side winding to excite it with a first frequency. The B-side circuitry may include a first detector circuit including at least one electronic component mounted to a surface of the bridge board on the B-side of the isolation boundary. The first detector circuit may have an input connected to the B-side winding and an output connected to the B-side contacts for providing an output signal to the B-side external circuit. The first detector circuit can be configured to selectively sense the first frequency and provide the output signal in response to the first driver circuit exciting the A-side winding with the first frequency.

FIG. 26 shows the opposite surface of the bridge board 520 which in the example shown does not have conductive material. The PCB layer 541 and the PCB layer 546 are at opposite sides of the bridge board 520.

In some implementations it may be desirable to reduce the A-side to B-side capacitance created between the two shields, e.g., shields 542-1 and 545-2 in FIGS. 22 and 25, for example to reduce noise coupling. An alternate embodiment of bridge board 620 is shown in FIGS. 27-32. The bridge board 620 as shown in FIGS. 27-32 is similar to the bridge board 520 of FIGS. 21-26 in that it has six conductive layers, 541, 542, 543, 544, 545, and 546 separated from each other by one or more insulation layers. The first (541), third (543), and fourth (544), conductive layers of bridge board 620 are essentially the same as the first (541), third (543), and fourth (544), PCB layers of bridge board 520. However, the large conductive shields 542-1 and 545-2 formed in the second (542) and fifth (545) conductive layers of bridge board 520 have been eliminated in bridge board 620 with the connections provided by the shields 542-1, 545-2 in bridge board 520 being instead provided by discrete conductive traces 542-8, 545-8 on the respective second and fifth conductive layers 542, 545 of bridge board 620. Shielding in bridge board 620 is instead provided in the sixth layer using shorted turns, 546-1, 546-2, 546-3, each of which is preferably positioned concentrically with its respective windings, 543-1 and 544-1, 543-2 and 544-2, 543-3 and 544-3.

Figure 29:
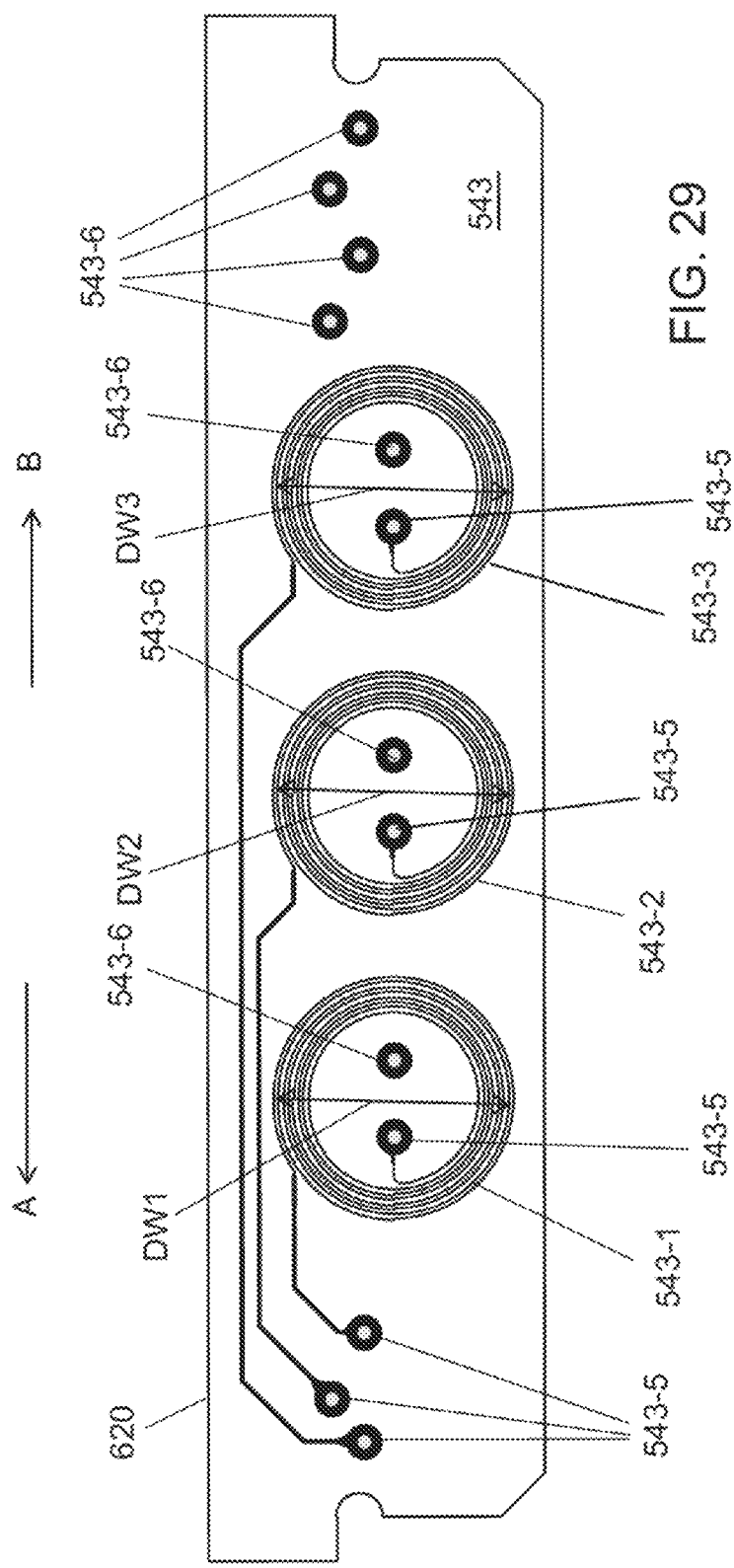
Figure 30:
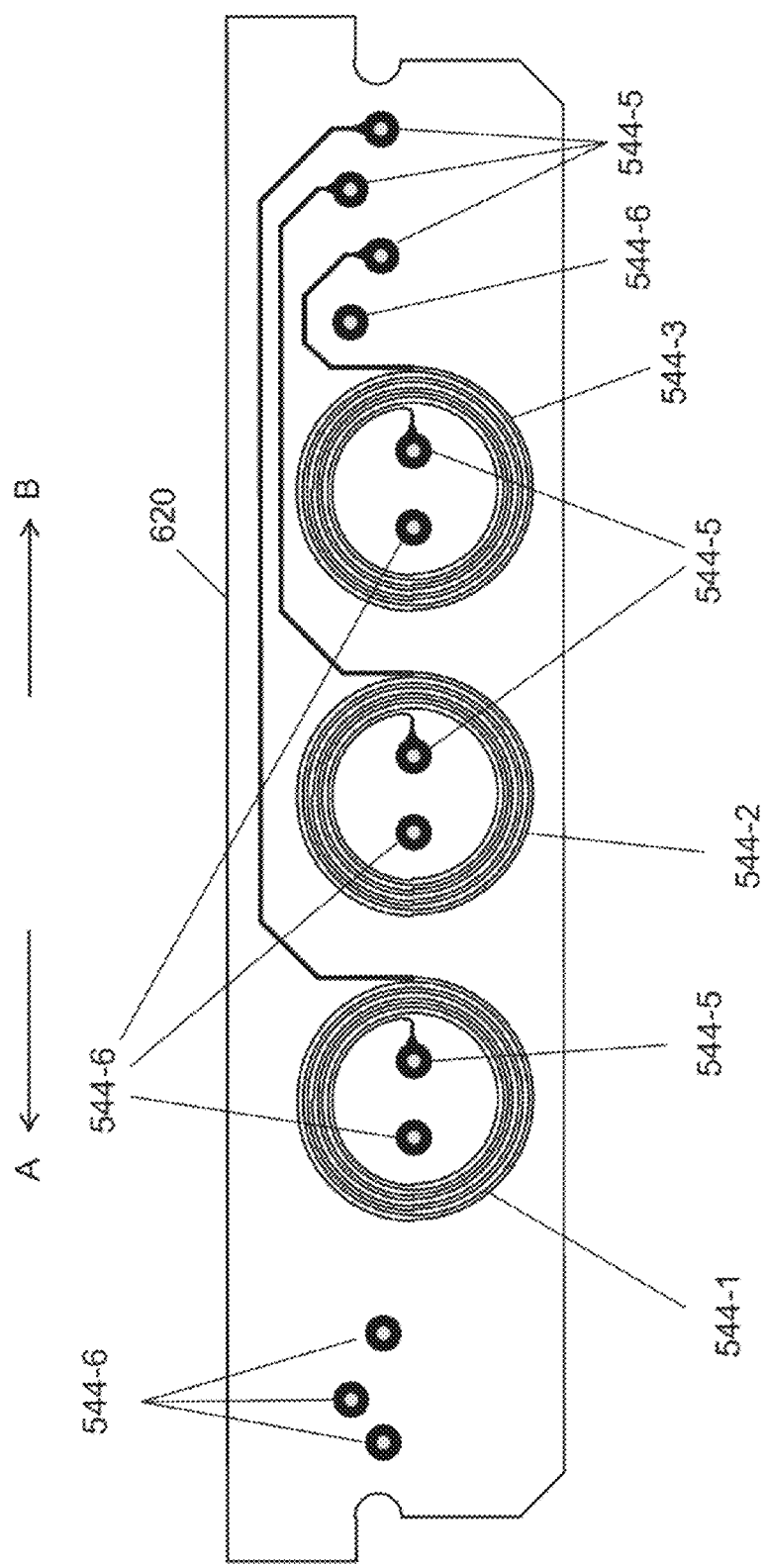
Figure 31:
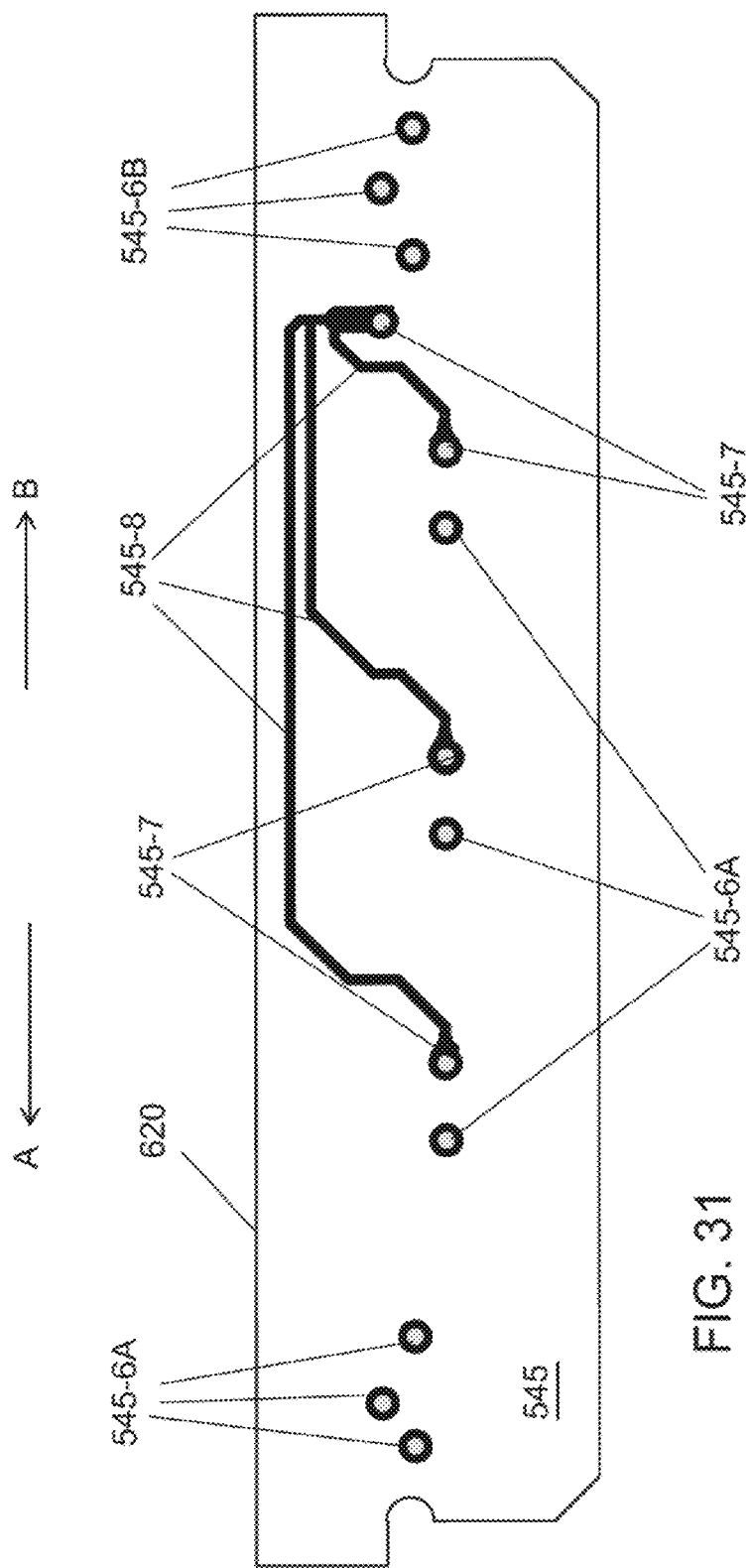

Each shorted turn 546-1, 546-2, 546-3 has a diameter that may be varied to adjust the leakage inductance and magnetizing inductance of its respective transformer. As shown in FIGS. 29 and 32, the diameter, DS1, DS2, DS3, of each shorted turn is slightly less than the diameter, DW1, DW2, DW3, of the outermost spiral of its respective windings. It may be desirable to reference the diameter of the shorted turn to its respective primary winding in embodiments in which the secondary winding is of a different diameter than the primary. As the diameter of the shorted turn is increased toward the diameter of the transformer winding(s), the transformer's leakage inductance will increase and magnetizing inductance will decrease. The size of the shorted turn may therefore be used to adjust the coupling coefficient of the transformers. The radial thickness of the shorted turn may also be adjusted to adjust the transformer characteristics and shielding.

The shorted turns 546-1, 546-2, 546-3 define regions in the bridge board 620 within which the transformer windings may be situated and may act as eddy current shields to attenuate magnetic fields that impinge in a direction perpendicular to the shorted turns. The shorted turns 546-1, 546-2, 546-3 therefore serve not only to partially contain magnetic fields associated with the windings in the region and reduce the magnitude of those fields outside of the region (e.g., external to the bridge board 620), but also to similarly reduce the susceptibility of the windings (and thus the isolator circuitry) to the effects of fields generated externally to the bridge board 620, e.g., from a nearby switching power converter (not shown). In this example, the shorted turns are located on one surface of the bridge board 620 but additional multi-surface configurations may be employed. Also, the regions in the bridge board beneath the shorted turns 546-1, 546-2, 546-3 may be free of magnetically permeable material, e.g., having a relative permeability $\mu_r$ of less than 2 or 5. The shorted turns may be floated (not connected to ground or any other circuit node) as shown in this example, or alternatively may be connected to a common node such as the A-side or B-side common terminal.

Other embodiments are within the scope of the following claims. For example, the substrate may be embodied as a multilayer fiberglass printed circuit board, as a multilayer ceramic substrate, or some combination thereof. The substrate may be a rigid, flexible, or composite semi-flexible printed circuit board. The isolator components may be protected by over-molding, e.g., with epoxy, thermoplastic, or other suitable materials, and preferably as a system in a package. Alternatively the isolator may be housed in an enclosure. In the example of FIGS. 17-20, the boards 510 and 530 are positioned along a first plane, and the bridge board 520 is positioned along a second plane perpendicular to the first plane. In some examples, the bridge board 520 is substantially perpendicular with respect to the input-side board 510 (and output side board 530). Here, the bridge board 520 is substantially perpendicular to the board 510 if the angle between the two boards 510, 520 is between 80° to 100°, taking into account manufacture and assembly tolerances. In some examples, the second plane can also be at other angles, e.g., between 0° to 89° relative to the second plane. For example, sockets can be mounted on the boards 510, 530 and oriented such that the bridge board 520 is parallel to the boards 510, 530 when inserted into the sockets. In some examples, the A-side contacts (521A including contacts 524A, 525A, 526A, and 527A) and the B-side contacts (521B including contacts 524B, 525B, 526B, and 527B) may be located on opposite surfaces of the bridge board.

In some implementations, the input-side circuit board 510 and the output-side circuit board 530 can be portions of a larger continuous circuit board. A portion of the larger circuit board between the input-side circuit board and the output-side circuit board can support additional components while still allowing separation of the input-side isolator interface circuitry and the output-side isolator interface circuitry.

In some implementations, the bridge board can include some or all of the isolator circuitry such as circuitry to drive one or more transformer windings and/or circuitry to detect excitation of one or more transformer windings. For example, the bridge board can include a first driver circuit having at least one electronic component, in which the at least one electronic component of the first driver circuit is mounted to a surface of the bridge board on the A-side of the isolation boundary. The first driver circuit can have an input connected to the A-side contacts for receiving an input signal from an external A-side circuit and an output connected to a first A-side winding (e.g., 543-1, 543-2, or 543-3) of one of the transformers to excite it with a first frequency. The bridge board can include a first detector circuit having at least one electronic component, in which the at least one electronic component of the first detector circuit is mounted to a surface of the bridge board on the B-side of the isolation boundary. The first detector circuit can have an input connected to a first B-side winding (e.g., 544-1, 544-2, or 544-3) of one of the transformers and an output connected to the B-side contacts for providing an output signal to a B-side external circuit. The first detector circuit can be configured to selectively sense the first frequency and provide the output signal in response to the first driver circuit exciting the first transformer with the first frequency. The at least one component of the first driver circuit and the at least one component of the first detector circuit can be mounted to the same surface of the bridge board. The bridge board can include a second driver circuit having an input for receiving a second input signal from the external B-side circuit and an output connected to a second B-side winding, the second driver circuit being configured to excite the second B-side winding with a second frequency. The bridge board can include a second detector circuit having an output for providing an output signal to the external A-side circuit and an input connected to the second A-side winding, the second detector circuit being configured selectively to sense the second frequency and provide the output signal in response to the second driver circuit exciting the second B-side winding with the second frequency. The first driver circuit can be powered exclusively by power received from the first input signal, and the first detector circuit can be powered exclusively by power received through the first transformer.

In some implementations, the bridge board isolator shown in FIG. 19 may include a power processing module extending between the input-side circuit board 510 and the output-side circuit board 530, alongside the bridge board 520. The power processing module may have input terminals coupled to the input-side circuit board 510 and output terminals coupled to the output-side circuit board 530. Examples of power processing modules are described in the "Power Adapter Packaging" patent application.

The shorted turns 546-1, 546-2, 546-3 may be positioned on the side of the bridge board 620 that faces noise sources such as the power processing module to reduce the susceptibility of the A-side and B-side windings to the effects of fields generated by the power processing module. In some implementations, there may be more than one power processing module, and the bridge board 620 may be positioned between two power processing modules. In this case, the shorted turns may be provided on both sides of the bridge board 620 to reduce the susceptibility of the A-side and B-side windings to the effects of fields generated by both power processing modules.

Each of the shorted turns 546-1, 546-2, 546-3 can be replaced with a conductive circle or a plurality of conductive concentric rings having different diameters. The shorted turns may be provided on two or more layers, and the A-side and B-side windings can be positioned between two or more shorted turns.

The bridge board 520 may be soldered directly to the input-side circuit board 510, output-side circuit board 530, or both.

What is claimed is:

1. An apparatus comprising:
   a bridge board comprising a multilayer substrate having a plurality of conductive layers separated by insulation and having a length, a set of A-side contacts located near an end of the bridge board on a first side of an isolation boundary, the isolation boundary dividing the length, and a set of B-side contacts located on a second side of the isolation boundary near an opposite end of the bridge board, the set of B-side contacts being separated by a predetermined distance from the A-side contacts;
   the bridge board including one or more transformers, each transformer including an A-side winding connected to the A-side contacts and a B-side winding connected to the B-side contacts;
   each A-side winding being galvanically isolated from each B-side contact and each B-side winding;
   each B-side winding being galvanically isolated from each A-side contact and each A-side winding;
   each A-side and B-side winding being formed in a respective conductive layer of the bridge board and being located in a region providing space for a magnetic field coupling the A-side and B-side windings;
   the bridge board being constructed and arranged to span a separation distance between an external A-side circuit having a set of A-side terminals located in an A-side area on a printed circuit board (PCB) and an external B-side circuit having a set of B-side terminals located in a B-side area on a PCB, with the A-side contacts of the bridge board aligned and mated with respective ones of the A-side terminals and the B-side contacts of the bridge board aligned and mated with respective ones of the B-side terminals;
   the bridge board providing a galvanically isolated mechanism for connecting the external A-side circuit to the external B-side circuit.

2. The apparatus of claim 1 wherein the one or more transformers comprise a plurality of transformers generally arranged in-line along the length and located in a mid-portion of the bridge board, the A-side windings of the transformers are formed in one conductive layer of the bridge board, and the B-side windings are formed in a second conductive layer of the bridge board.

3. The apparatus of claim 1 wherein the one or more transformers comprise three transformers, the A-side windings of the transformers are formed in one conductive layer of the bridge board, and the B-side windings are formed in a second conductive layer of the bridge board.

4. The apparatus of claim 1 wherein the at least one conductive shield comprises a first conductive shield formed in a third conductive layer and electrically connected to a respective one of the A-side or B-side contacts.

5. The apparatus of claim 4 wherein the at least one conductive shield comprises a second conductive shield formed in a fourth conductive layer and electrically connected to a respective one of the A-side or B-side contacts.

6. The apparatus of claim 5 wherein the bridge board comprises a fifth conductive layer in which the A side and B-side contacts are formed.

7. The apparatus of claim 6 wherein the A-side and B-side contacts are conductive pads exposed on an external surface of the bridge board.

8. The apparatus of claim 6 wherein the conductive layers of the bridge board are arranged in the following sequence: third conductive layer, first conductive layer, second conductive layer, fourth conductive layer, and fifth conductive layer.

9. The apparatus of claim 1 wherein the isolation boundary between the A-side windings and the B-side windings comprises a layer of insulating material between the first and second conductive layers.

10. The apparatus of claim 1 wherein the at least one conductive shield comprises an A-side shield and a B-side shield and the multi-layer printed circuit board comprises the following layers in sequence:
    a third conductive layer in which the A-side shield is formed;
    a first conductive layer in which the A-side windings are formed;
    a second conductive layer in which the B-side windings are formed;
    a fourth conductive layer in which the B-side shield is formed;
    a fifth conductive layer in which the A-side and B-side contacts are formed;
    and wherein the conductive layers being separated from adjacent conductive layers by at least one intervening insulation layer.

11. The apparatus of claim 1 wherein the at least one conductive shield comprises one or more shorted turns aligned with a respective one of the one or more transformers, and the multi-layer printed circuit board comprises the following layers:
    a first conductive layer in which the A-side windings are formed;
    a second conductive layer in which the B-side windings are formed;
    a fifth conductive layer in which the A-side and B-side contacts are formed;
    a sixth conductive layer in which the one or more shorted turns formed;
    and wherein the conductive layers are separated from adjacent conductive layers by at least one intervening insulation layer.

12. The apparatus of claim 11 wherein the sixth conductive layer is located on an external surface of the PCB.

13. The apparatus of claim 11 wherein A-side windings and B-side windings each comprises an outer winding diameter and the one or more shorted turns each comprises an outer shorted turn diameter, and the outer shorted turn diameter of each shorted turn is less than the outer winding diameter of at least one of its respective A-side or B-side winding.

14. The apparatus of claim 11 wherein a respective one of the one or more shorted turns is aligned with the A-side winding and B-side winding of each of the one or more transformers.

15. The apparatus of claim 1 further comprising:
a first printed circuit board including the external A-side circuit and a first driver circuit, the first driver circuit having an input for receiving a first input signal from the external A-side circuit and an output connected to the A-side terminals for making electrical connection with a first A-side winding through respective A-side contacts, the first driver circuit being configured to excite the respective A-side winding with a first frequency;
the external B-side circuitry separated from the external A-side circuitry by the separation distance;
a first detector circuit located near the external B-side circuit, the first detector circuit having an output for providing an output signal to the external B-side circuit and an input connected to the B-side terminals for making electrical connection with a first B-side winding through respective B-side contacts, the first detector circuit being configured to selectively sense the first frequency and provide the output signal in response to the first driver circuit exciting the first A-side winding with the first frequency.

16. The apparatus of claim 15 wherein the external B-side circuit and the first detector circuit are located on a second printed circuit board.

17. The apparatus of claim 15 wherein the external B-side circuit and the first detector circuit are located on the first printed circuit board.

18. The apparatus of claim 16 further comprising a power processing module having input terminals, output terminals, and a length, a width, and a height;
wherein the power processing module is arranged between the first printed circuit board and the second printed circuit board and the bridge board is arranged alongside the power processing module extending between the first circuit board and the second printed circuit board.

19. The apparatus of claim 18 wherein the bridge board is substantially perpendicular to the first or second PCB.

20. The apparatus of claim 19 wherein the first and second PCBs are substantially parallel to each other.

21. The apparatus of claim 18 wherein the bridge board and the first or second PCB form an oblique angle.

22. The apparatus of claim 21 wherein the first and second PCBs are substantially parallel to each other.

23. The apparatus of claim 1 further comprising:
a first driver circuit including at least one electronic component mounted to a surface of the bridge board on the A-side of the isolation boundary, the first driver circuit having an input connected to the A-side contacts for receiving an input signal from the external A-side circuit and an output connected to the A-side winding of a first one of the one or more transformers to excite it with a first frequency.

24. The apparatus of claim 1 further comprising:
a first detector circuit including at least one electronic component mounted to a surface of the bridge board on the B-side of the isolation boundary, the first detector circuit having an input connected to the B-side winding of a first of the one or more transformers and an output connected to the B-side contacts for providing an output signal to the B-side external circuit.

25. The apparatus of claim 1 further comprising:
a first driver circuit including at least one electronic component mounted to a surface of the bridge board on the A-side of the isolation boundary, the first driver circuit having an input connected to the A-side contacts for receiving an input signal and an output connected to the A-side winding of a first of the one or more transformers for stimulating the A-side winding with a first frequency;
a first detector circuit including at least one electronic component mounted to a surface of the bridge board on the B-side of the isolation boundary, the first detector circuit having an input connected to the B-side winding of the first transformer and an output connected to the B-side contacts for providing an output signal, the first detector circuit being configured to selectively sense the first frequency and provide the output signal in response to the first driver circuit exciting the first transformer with the first frequency.

26. The apparatus of claim 25 wherein the at least one component of the driver circuit and the at least one component of the detector circuit are mounted to the same surface of the bridge board.

27. The apparatus of claim 1 wherein the A-side contacts and B-side contacts are located on the same surface of the bridge board.

28. The apparatus of claim 1 wherein the A-side contacts and B-side contacts are located on opposite surfaces of the bridge board.

29. The apparatus of claim 1 wherein the A-side or B-side terminals comprise contact fingers configured to mate with respective A-side or B-side contacts on the bridge board.

30. The apparatus of claim 15 wherein the first PCB is positioned within a first plane and the bridge board is positioned within a second plane at an angle to the first plane.

31. The apparatus of claim 30 wherein the angle is approximately 90 degrees.

32. The apparatus of claim 1 wherein the conductive shield comprises a conductive material applied to a surface of the multilayer printed circuit board.

33. The apparatus of claim 15 wherein the A-side or B-side terminal further comprises contact fingers configured to mate with respective A-side or B-side contacts on the bridge board and the bridge board further comprises a contour including at least one feature adapted to form a predetermined alignment between the bridge board and the first PCB.

34. The apparatus of claim 15 wherein the first driver circuit further comprises an oscillator powered exclusively by power received from the first input signal.

35. The apparatus of claim 15 wherein the first detector circuit is powered exclusively by power received from the first B-side winding.

36. The apparatus of claim 15 wherein the first detector circuit is powered exclusively by power received from the first driver circuit through the first transformer, and the first driver circuit is powered exclusively by power received from the first input signal.

37. The apparatus of claim 15 wherein the first driver circuit further comprises an oscillator adapted to excite the first A-side winding with amplitude modulated as a function of the first input signal.

38. The apparatus of claim 37 wherein the first detector circuit is adapted to provide an analog output signal having an amplitude that is a function of the amplitude of the excitation.

39. The apparatus of claim 15 wherein the first detector circuit includes an open-collector output.

40. The apparatus of claim 15 wherein the first detector circuit sinks a current as the output signal.

41. The apparatus of claim 15 wherein the first detector circuit is adapted to provide a binary output signal having a state that is a function of the presence or absence of the excitation.

42. The apparatus of claim 35 wherein the first detector circuit includes an open-collector output.

43. The apparatus of claim 35 wherein the first detector circuit sinks a current as the output signal.

44. The apparatus of claim 1 wherein the region is free of magnetically permeable material.

45. The apparatus of claim 1 wherein the one or more transformers are loosely coupled.

46. The apparatus of claim 45 wherein the one or more transformers is characterized by a coupling coefficient between the windings that is less than 60%.

47. The apparatus of claim 45 wherein the transformer is characterized by a coupling coefficient between the windings that is less than 35%.

48. The apparatus of claim 1 wherein:
the one or more transformers comprise a first transformer and a second transformer, respectively comprising first and second A-side and B-side windings;
the at least one conductive shield is formed in one or more conductive layers of the multi-layer printed circuit board; and
wherein the apparatus further comprises:
a first printed circuit board including the external A-side circuit and A-side terminals;
a second printed circuit board including the external B-side circuit and B-side terminals;
the second printed circuit board being separated by a first distance from the first printed circuit board;
a first driver circuit having an input for receiving a first input signal from the external A-side circuit and an output connected to the first A-side winding, the first driver circuit being configured to excite the first A-side winding with a first frequency;
a first detector circuit having an output for providing an output signal to the external B-side circuit and an input connected to the first B-side winding, the first detector circuit being configured to selectively sense the first frequency and provide the output signal in response to the first driver circuit exciting the first A-side winding with the first frequency;
a second driver circuit having an input for receiving a second input signal from the external B-side circuit and an output connected to the second B-side winding, the second driver circuit being configured to excite the second B-side winding with a second frequency;
a second detector circuit having an output for providing an output signal to the external A-side circuit and an input connected to the second A-side winding, the second detector circuit being configured selectively to sense the second frequency and provide the output signal in response to the second driver circuit exciting the second B-side winding with the second frequency.

49. The apparatus of claim 48 wherein the first driver and second detector are located on the first PCB and the second driver and the first detector are located on the second PCB.

50. The apparatus of claim 48 wherein the first and second drivers and the first and second detectors are located on the multilayer printed circuit board.

51. The apparatus of claim 48 wherein the first driver circuit is powered exclusively by power received from the first input signal.

52. The apparatus of claim 48 wherein the first detector circuit is powered exclusively by power received through the first transformer.

53. The apparatus of claim 1 in which the multilayer substrate comprises a rigid printed circuit board or a flexible circuit.

54. The apparatus of claim 1 in which the A-side circuit and the B-side circuit are located on a same printed circuit board.

55. The apparatus of claim 1 in which the A-side circuit is located on a first printed circuit board, and the B-side circuit is located on a second printed circuit board that is separated from the first printed circuit board.

56. The apparatus of claim 1 in which the A-side contacts of the bridge board are removably mated with respective ones of the A-side terminals, and the B-side contacts of the bridge board are removably mated with respective ones of the B-side terminals.

57. The apparatus of claim 1 in which the A-side contacts of the bridge board are soldered to respective ones of the A-side terminals, and the B-side contacts of the bridge board are soldered to respective ones of the B-side terminals.

58. The apparatus of claim 1 in which the bridge board comprises at least one conductive shield.

59. An apparatus comprising:
an A-side printed circuit board having a set of A-side terminals;
a B-side printed circuit board having a set of B-side terminals; and
a bridge board comprising a multilayer substrate having a plurality of conductive layers separated by insulation and having a set of A-side contacts located near a first end of the bridge board, and a set of B-side contacts located near a second end of the bridge board, the set of B-side contacts being separated by a distance from the A-side contacts, the A-side contacts of the bridge board aligned and mated with respective ones of the A-side terminals, the B-side contacts of the bridge board aligned and mated with respective ones of the B-side terminals;
the bridge board including an A-side winding connected to the A-side contacts and a B-side winding connected to the B-side contacts;
wherein the A-side winding is galvanically isolated from the B-side contacts and the B-side winding, the B-side winding is galvanically isolated from the A-side contacts and the A-side winding; and
wherein each A-side and B-side winding is formed in a respective conductive layer of the bridge board and located in a region providing space for a magnetic field coupling the A-side winding and the B-side winding.

60. The apparatus of claim 59, in which the A-side circuit board comprises a driver circuit, the driver circuit having an input for receiving an input signal from an external A-side circuit and an output connected to the A-side terminals for making electrical connection with the A-side winding through respective A-side contacts, the driver circuit being configured to excite the A-side winding with a first frequency.

61. The apparatus of claim 60 in which the B-side circuit board comprises a detector circuit having an output for providing an output signal to an external B-side circuit and an input connected to the B-side terminals for making electrical connection with a B-side winding through respective B-side contacts, the detector circuit being configured to selectively sense the first frequency and provide the output signal in response to the driver circuit exciting the A-side winding with the first frequency.

62. The apparatus of claim 60, further comprising a power processing module having input terminals and output terminals, in which the power processing module is arranged between the A-side circuit board and the B-side circuit board, and the bridge board is arranged alongside the power processing module extending between the A-side circuit board and the B-side circuit board.

63. The apparatus of claim 60 in which the A-side circuit board and the B-side circuit board are connected as an integral piece.

64. The apparatus of claim 59 wherein the at least one conductive shield comprises one or more shorted turns formed in a conductive layer of the PCB and aligned with at least one of the A-side or B-side windings and the region is bounded on at least one end by the one or more shorted turns.

65. The apparatus of claim 59 wherein the at least one conductive shield comprises a first conductive shield formed in a conductive layer of the PCB and a second conductive shield formed in a conductive layer of the PCB, and the region is bounded between the first and second conductive shields.

66. A method of providing galvanic isolation for one or more signals, the method comprising:
providing a bridge board for supporting isolator circuitry, the bridge board comprising a substrate and a plurality of parallel conductive layers separated by insulation, the bridge board having an A-side winding in a first conductive layer of the substrate and a B-side winding in a second conductive layer of the substrate;
coupling the bridge board to an A-side printed circuit board (PCB) that has a driver circuit having an input for receiving an input signal and an output electrically coupled to the A-side winding;
coupling the bridge board to a B-side PCB that has a detector circuit having an input for receiving a signal from the B-side winding;
exciting, using the driver circuit, the A-side winding at a first frequency in response to the input signal;
selectively sensing, using the detector circuit, the first frequency at the B-side winding; and
providing an output signal at an output of the B-side circuit board in response to sensing the first frequency.

67. The method of claim 66 in which exciting the A-side winding at a first frequency comprises exciting the A-side winding at a first frequency using power derived from the input signal.

68. The method of claim 67 in which providing an output signal comprises providing an output signal at an output of the B-side circuit board using power derived from the B-side winding.

69. The method of claim 66 further comprising providing one or more shorted turns to create a region for the windings to reduce effects from extraneous magnetic fields.

70. The method of claim 66 further comprising providing one or more conductive shields to create a region for the windings to reduce effects from extraneous magnetic fields.

71. A method of providing galvanic isolation for one or more signals, the method comprising:
using a driver circuit on an A-side printed circuit board (PCB) to drive an A-side winding in a bridge board coupled to the A-side PCB at a first frequency, the bridge board having A-side contacts that are coupled to A-side terminals on the A-side PCB, the A-side contacts being electrically coupled to the A-side winding;
using a detector circuit on a B-side PCB to selectively sense the first frequency at a B-side winding in the bridge board, the bridge board having B-side contacts that are coupled to B-side terminals on the B-side PCB, the B-side contacts being electrically coupled to the B-side winding; and
generating an output signal at an output of the B-side circuit board in response to sensing the first frequency.

72. The method of claim 71 in which exciting the A-side winding at a first frequency comprises exciting the A-side winding at a first frequency using power derived from an input signal received at an input of the A-side circuit board.

73. The method of claim 72 in which providing an output signal comprises providing an output signal at an output of the B-side circuit board using power derived from the B-side winding.

74. The method of claim 71 in which the A-side contacts are removably coupled to the A-side terminals on the A-side PCB and the B-side contacts are removably coupled to the B-side terminals on the B-side PCB.

75. The method of claim 71 in which the A-side contacts are soldered to the A-side terminals on the A-side PCB and the B-side contacts are soldered to the B-side terminals on the B-side PCB.

* * * * *